(12) United States Patent
Masuoka et al.

(10) Patent No.: US 8,378,425 B2
(45) Date of Patent: Feb. 19, 2013

(54) SEMICONDUCTOR STORAGE DEVICE

(75) Inventors: Fujio Masuoka, Tokyo (JP); Shintaro Arai, Tokyo (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 641 days.

(21) Appl. No.: 12/699,647

(22) Filed: Feb. 3, 2010

(65) Prior Publication Data

US 2010/0219483 A1    Sep. 2, 2010

Related U.S. Application Data

(63) Continuation of application No. PCT/JP2009/051460, filed on Jan. 29, 2009.

(60) Provisional application No. 61/207,634, filed on Feb. 13, 2009.

(30) Foreign Application Priority Data

Jan. 29, 2008 (WO) .................. PCT/JP2008/051301

(51) Int. Cl.
*H01L 21/70* (2006.01)
*H01L 21/8244* (2006.01)

(52) U.S. Cl. . 257/368; 257/379; 257/393; 257/E21.661; 257/E21.703; 257/E27.099; 438/238; 438/275; 438/279

(58) Field of Classification Search .................. 257/368, 257/379, 393, E21.661, E21.703, E27.099, 257/E27.112; 438/238, 275, 279
See application file for complete search history.

(56) References Cited

U.S. PATENT DOCUMENTS

| | | | | |
|---|---|---|---|---|
| 5,051,958 A | * | 9/1991 | Arakawa | 365/185.08 |
| 5,244,824 A | * | 9/1993 | Sivan | 438/245 |
| 5,365,475 A | * | 11/1994 | Matsumura et al. | 365/154 |
| 5,382,816 A | * | 1/1995 | Mitsui | 257/266 |
| 5,480,838 A | | 1/1996 | Mitsui | |
| 5,656,842 A | * | 8/1997 | Iwamatsu et al. | 257/329 |

(Continued)

FOREIGN PATENT DOCUMENTS

CN    1507035 A    6/2004
EP    2239770 A1    10/2010

(Continued)

OTHER PUBLICATIONS

Watanabe, Shigeyoshi et al., "A Novel Circuit Technology with Surrounding Gate Transistors (SGT's) for Ultra High Density DRAM's," IEEE Journal of Solid-State Circuits, vol. 30, No. 9, Sep. 1995, pp. 960-971.

(Continued)

*Primary Examiner* — Zandra Smith
*Assistant Examiner* — Tsz Chiu
(74) *Attorney, Agent, or Firm* — Brinks Hofer Gilson & Lione

(57) ABSTRACT

It is intended to achieve a sufficiently-small SRAM cell area and a stable operation margin in a CMOS 6T-SRAM comprising a vertical transistor SGT. In a static type memory cell made up using six MOS transistors, each of the MOS transistor constituting the memory cell is formed on a planar silicon layer formed on a buried oxide film, to have a structure where a drain, a gate and a source are arranged in a vertical direction, wherein the gate is formed to surround a pillar-shaped semiconductor layer. The planar silicon layer comprises a first active region having a first conductive type, and a second active region having a second conductive type. The first and second active regions are connected to each other through a silicide layer formed in a surface of the planar silicon layer to achieve an SRAM cell having a sufficiently-small area.

15 Claims, 30 Drawing Sheets

U.S. PATENT DOCUMENTS

| | | | |
|---|---|---|---|
| 5,767,549 A | 6/1998 | Chen et al. | |
| 5,923,582 A * | 7/1999 | Voss | 365/154 |
| 5,994,735 A | 11/1999 | Maeda et al. | |
| 6,127,209 A | 10/2000 | Maeda et al. | |
| 6,175,138 B1 * | 1/2001 | Noda | 257/392 |
| 6,624,459 B1 * | 9/2003 | Dachtera et al. | 257/296 |
| 7,052,941 B2 | 5/2006 | Lee | |
| 7,193,278 B2 | 3/2007 | Song | |
| 7,579,214 B2 | 8/2009 | Yamazaki et al. | |
| 8,053,842 B2 * | 11/2011 | Masuoka et al. | 257/369 |
| 8,080,458 B2 * | 12/2011 | Masuoka et al. | 438/268 |
| 8,198,654 B2 * | 6/2012 | Masuoka et al. | 257/204 |
| 2002/0195652 A1 | 12/2002 | Maeda et al. | |
| 2003/0026124 A1 * | 2/2003 | Nagaoka | 365/154 |
| 2004/0113207 A1 * | 6/2004 | Hsu et al. | 257/368 |
| 2004/0135215 A1 | 7/2004 | Song | |
| 2006/0261406 A1 | 11/2006 | Chen | |
| 2007/0007601 A1 | 1/2007 | Hsu et al. | |
| 2007/0138557 A1 | 6/2007 | Ipposhi | |
| 2008/0054350 A1 * | 3/2008 | Breitwisch et al. | 257/330 |
| 2009/0114989 A1 | 5/2009 | Hamamoto | |
| 2009/0290082 A1 | 11/2009 | Yamazaki et al. | |
| 2010/0087017 A1 * | 4/2010 | Masuoka et al. | 438/9 |
| 2010/0142257 A1 * | 6/2010 | Masuoka et al. | 365/149 |
| 2010/0200913 A1 * | 8/2010 | Masuoka et al. | 257/329 |
| 2010/0203714 A1 * | 8/2010 | Masuoka et al. | 438/586 |
| 2010/0207213 A1 | 8/2010 | Tan et al. | |
| 2011/0018056 A1 * | 1/2011 | Takeuchi | 257/329 |

FOREIGN PATENT DOCUMENTS

| | | |
|---|---|---|
| EP | 2239771 A1 | 10/2010 |
| JP | 63-158866 A | 7/1988 |
| JP | 64-089560 A | 4/1989 |
| JP | 02-188966 A | 7/1990 |
| JP | 03-225873 A | 10/1991 |
| JP | 04-234166 A | 8/1992 |
| JP | 06-021467 A | 1/1994 |
| JP | 06-069441 A | 3/1994 |
| JP | 06-237003 A | 8/1994 |
| JP | 07-099311 A | 4/1995 |
| JP | 10-079482 A | 3/1998 |
| JP | 10-223777 A | 8/1998 |
| JP | 2003-068883 A | 3/2003 |
| JP | 2003-224211 A | 8/2003 |
| JP | 2004-193588 A | 7/2004 |
| JP | 2008-205168 A | 9/2008 |
| KR | 2004-0063348 A | 7/2004 |
| WO | WO 2009/096465 A1 | 8/2009 |
| WO | WO 2009/096466 A1 | 8/2009 |

OTHER PUBLICATIONS

Written Opinion of the International Searching Authority for International Application No. PCT/JP2008/051301, dated Apr. 1, 2008, 5 pages.

Written Opinion of the International Searching Authority for International Application No. PCT/JP2009/051460, dated Apr. 21, 2009, 5 pages.

Chen, Yijian et al., "Vertical integrated-gate CMOS for ultra-dense IC," Microelectronic Engineering, vol. 83, 2006, pp. 1745-1748.

Extended European Search Report for European Application No. 10009579.3, dated Jun. 11, 2012, 11 pages.

International Search Report for International Application No. PCT/JP2008/051301, dated Apr. 1, 2008, 2 pages.

International Search Report for International Application No. PCT/JP2009/051460, dated Apr. 21, 2009, 2 pages.

Office Action for Chinese Patent Application Serial No. 200980103454.9, dated Oct. 31, 2012, 7 pages.

* cited by examiner (a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

SEMICONDUCTOR STORAGE DEVICE

RELATED APPLICATIONS

Pursuant to 35 U.S.C. §119(e), this application claims the benefit of the filing date of Provisional U.S. Patent Application Ser. No. 61/207,634 filed on Feb. 13, 2009. This application is a continuation application of PCT/JP2009/051460 filed on Jan. 29, 2009 which claims priority under 35 U.S.C. §365(a) to PCT/JP2008/051301 filed on Jan. 29, 2008. The entire contents of these applications are hereby incorporated by reference.

TECHNICAL FIELD

The present invention relates to a semiconductor storage device, and more particularly to a semiconductor storage device comprising an SRAM (Static Random Access Memory).

BACKGROUND ART

With a view to achieving higher integration and higher performance of a semiconductor device, an SGT (Surrounding Gate Transistor) has been proposed which is a vertical transistor comprising a pillar-shaped semiconductor layer formed on a surface of a semiconductor substrate, and a gate formed to surround a sidewall of the pillar-shaped semiconductor layer (as disclosed, for example, in Patent Document 1: JP 2-188966A). In the SGT, a source, a gate and a drain are arranged in a vertical direction, so that an occupancy area can be significantly reduced as compared with a conventional planar transistor.

In cases where an LSI (large-scale integration) circuit is made up using an SGT, it is essential to employ an SRAM comprising a combination of a plurality of SGTs, as a cache memory for the LSI circuit. In recent years, there is an extremely strong need for increasing a capacity of an SRAM to be mounted on an LSI circuit. Thus, in the SGT-based LSI circuit, it is also essential to achieve an SRAM having a sufficiently-small cell area.

FIG. 28(a) and FIG. 28(b) are, respectively, a top plan view and a sectional view of a CMOS 6T-SRAM disclosed as one embodiment in Patent Document 1 (JP 7-99311A), wherein an SRAM cell comprises six transistors each designed using an SGT. With reference to FIGS. 28(a) and 28(b), a structure of the SRAM cell will be described below. A bit line, a ground line GND, and a power supply potential line Vcc, are formed by an $N^+$ diffusion layer (801a, 801b), an $N^+$ diffusion layer 802, and a $P^+$ diffusion layer 803. Six pillar-shaped silicon layers are formed on the diffusion layers to constitute two access transistors 810a, 810b each operable to allow access to a memory cell, two driver transistors 811a, 811b each operable to drive the memory cell, and two load transistors 812a, 812b each operable to supply electric charges to the memory cell. Further, a gate (804a, 804b, 804c, 804d) is formed to surround each of the pillar-shaped silicon layers. A storage node is made up of an interconnection layer (807a, 807b). In each of the transistors constituting the SRAM cell, a source, a gate and a drain are vertically formed on and along the pillar-shaped silicon layer, so that the SRAM can be designed to have a sufficiently-small cell area.

Patent Document 1: JP 2-188966A
Patent Document 2: JP 7-99311A (paragraph [0051], FIG. 75)

In reality, the above SRAM cell involves the following problem. In the SRAM discloses in the Parent Document 2, each of the power supply potential line 803 and the ground line 802 in an SRAM cell array can be formed at a level of minimum size so as to achieve a sufficiently-small cell area. However, the power supply potential line 803 and the ground line 802 are formed by the P+ diffusion layer and the N+ diffusion layer, respectively. Thus, if each of the power supply potential line 803 and the ground line 802 is formed at a level of minimum size, a resistance thereof will be extremely increased to preclude a possibility to ensure a stable operation of the SRAM. Conversely, if the size of each of the power supply potential line 803 and the ground line 802 is increased so as to allow the SRAM to stably operate, the SRAM cell area will be increased.

In view of the above circumstances, it is an object of the present invention to provide an SGT-based CMOS 6T-SRAM capable of achieving a reduction in area of an SRAM cell, while ensuring a sufficient operation margin of the SRAM cell.

SUMMARY OF THE INVENTION

In order to achieve the above object, the present invention provides a semiconductor storage device comprising a static type memory cell in which six MOS transistors are arrayed on a dielectric film formed on a substrate. The semiconductor storage device is characterized in that each of the six MOS transistors comprises a source diffusion layer, a drain diffusion layer, a pillar-shaped semiconductor layer disposed between the source and drain diffusion layers, and a gate formed along a sidewall of the pillar-shaped semiconductor layer, wherein the source diffusion layer, the drain diffusion layer and the pillar-shaped semiconductor layer are arranged on the dielectric film formed on the substrate, hierarchically in a vertical direction, and wherein the six MOS transistors function as respective ones of first and second NMOS access transistors each operable to allow access to the memory cell, first and second NMOS driver transistors each operable to drive a storage node to hold data in the memory cell, and first and second PMOS load transistors each operable to supply electric charges to hold data in the memory cell. The first NMOS access transistor, the first NMOS driver transistor and the first PMOS load transistor are arrayed in adjacent relation to each other, and the second NMOS access transistor, the second NMOS driver transistor and the second PMOS load transistor are arrayed in adjacent relation to each other. The source or drain diffusion layers of the first NMOS access transistor, the first NMOS driver transistor and the first PMOS load transistor, are arranged on the dielectric film as three first diffusion layers to serve as a first storage node for holding data therein, wherein the first diffusion layers are connected to each other through a first silicide layer formed on respective surfaces of the first diffusion layers. The source or drain diffusion layers of the second NMOS access transistor, the second NMOS driver transistor and the second PMOS load transistor, are arranged on the dielectric film as three second diffusion layers to serve as a second storage node for holding data therein, wherein the second diffusion layers are connected to each other through a second silicide layer formed on respective surfaces of the second diffusion layers.

In a preferred embodiment of the present invention, a gate line extending from the respective gates of the driver transistor and the load transistor each formed on corresponding ones of the first diffusion layers serving as the first storage node is connected to a common contact, and a gate line extending from the respective gates of the driver transistor and the load transistor each formed on corresponding ones of the second diffusion layers serving as the second storage node is connected to a common contact. In another preferred embodiment of the present invention, a gate line extending from the respective gates of the driver transistor and the load transistor each formed on corresponding ones of the first diffusion layers serving as the first storage node is connected to one of the second diffusion layers serving as the second storage node, through a common contact, and a gate line extending from the respective gates of the driver transistor and the load transistor each formed on corresponding ones of the second diffusion layers serving as the second storage node is connected to one of the first diffusion layers serving as the first storage node, through a common contact.

In yet another preferred embodiment of the present invention, a peripheral length of the sidewall in each of the pillar-shaped semiconductor layers forming the access transistors, the pillar-shaped semiconductor layers forming the driver transistors and the pillar-shaped semiconductor layers forming the load transistors, is determined based on an operation margin during reading and an operation margin during writing.

In still another preferred embodiment of the present invention, a contact to be formed on a gate line extending from a gate electrode of at least one of the first and second NMOS access transistors is shared as a contact to be formed on a gate line extending from a gate electrode of an NMOS access transistor in an adjacent memory cell.

In yet still another preferred embodiment of the present invention, the pillar-shaped semiconductor layers are arrayed in a hexagonal lattice pattern.

In the semiconductor storage device of the present invention, the six MOS transistors may be arranged on the dielectric film in a three-row by two-column array, wherein: the first NMOS access transistor is arranged at an intersection of the 1st row and the 1st column; the first PMOS load transistor is arranged at an intersection of the 2nd row and the 1st column; the first NMOS driver transistor is arranged at an intersection of the 3rd row and the 1st column; the second NMOS access transistor is arranged at an intersection of the 3rd row and the 2nd column; the second PMOS load transistor is arranged at an intersection of the 2nd row and the 2nd column; and the second NMOS driver transistor is arranged at an intersection of the 1st row and the 2nd column.

Alternatively, in the semiconductor storage device of the present invention, the six MOS transistors may be arranged on the dielectric film in a three-row by two-column array, wherein: the first NMOS access transistor is arranged at an intersection of the 1st row and the 1st column; the first PMOS load transistor is arranged at an intersection of the 3rd row and the 1st column; the first NMOS driver transistor is arranged at an intersection of the 2nd row and the 1st column; the second NMOS access transistor is arranged at an intersection of the 3rd row and the 2nd column; the second PMOS load transistor is arranged at an intersection of the 1st row and the 2nd column; and the second NMOS driver transistor is arranged at an intersection of the 2nd row and the 2nd column.

Alternatively, in the semiconductor storage device of the present invention, the six MOS transistors may be arranged on the dielectric film in a three-row by two-column array, wherein: the first NMOS access transistor is arranged at an intersection of the 1st row and the 1st column; the first PMOS load transistor is arranged at an intersection of the 3rd row and the 1st column; the first NMOS driver transistor is arranged at an intersection of the 2nd row and the 1st column; the second NMOS access transistor is arranged at an intersection of the 1st row and the 2nd column; the second PMOS load transistor is arranged at an intersection of the 3rd row and the 2nd column; and the second NMOS driver transistor is arranged at an intersection of the 2nd row and the 2nd column.

Alternatively, in the semiconductor storage device of the present invention, the six MOS transistors may be arranged on the dielectric film in a two-row by three-column array, wherein: the first NMOS access transistor is arranged at an intersection of the 1st row and the 1st column; the first PMOS load transistor is arranged at an intersection of the 2nd row and the 2nd column; the first NMOS driver transistor is arranged at an intersection of the 2nd row and the 1st column; the second NMOS access transistor is arranged at an intersection of the 2nd row and the 3rd column; the second PMOS load transistor is arranged at an intersection of the 1st row and the 2nd column; and the second NMOS driver transistor is arranged at an intersection of the 1st row and the 3rd column.

DETAILED DESCRIPTION OF THE PREFERRED EMBODIMENTS

First Embodiment

Figure 1:
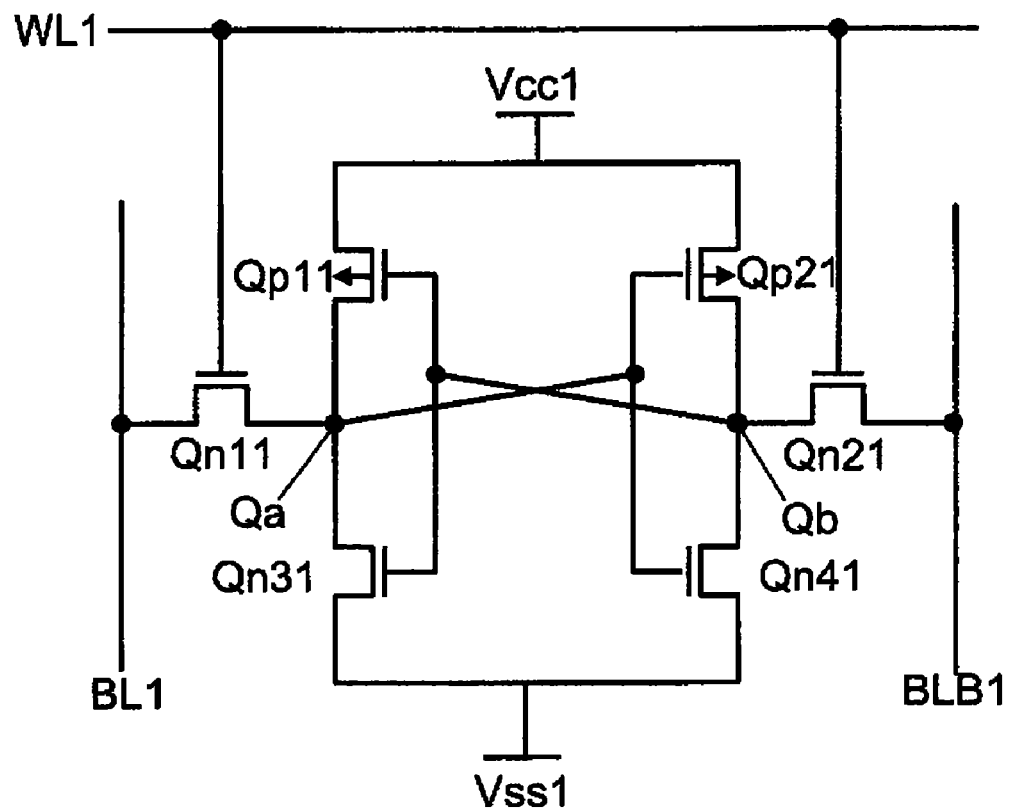
FIG. 1 illustrates an equivalent circuit of a memory cell of an SRAM according to a first embodiment of the present invention.

FIG. 1 illustrates an equivalent circuit of a memory cell in a CMOS 6T-SRAM according to a first embodiment of the present invention. In FIG. 1, each of BL1 and BLB1 indicates a bit line, and WL1 indicates a word line. Vcc 1 indicates a power supply potential, and Vss1 indicates a ground potential. Each of Qn11 and Qn21 indicates an access transistor operable to allow access to the memory cell, and each of Qn31 and Qn41 indicates a driver transistor operable to drive the memory cell. Each of Qp11 and Qp21 indicates a load transistor operable to supply electric charges to the memory cell, and each of Qa and Qb indicates a storage node for storing data.

As one example of an operation of the memory cell in FIG. 1, a read operation under a condition that data "L" is stored in the storage node Qa, and data "H" is stored in the storage node Qb, will be described below. In the read operation, each of the bit lines BL1, BLB1 is pre-charged to an "H" potential. After completion of the pre-charge, data reading is initiated when the word line WL1 is set to an "H" state. At this timing, each of the access transistors Qn11, Qn12 is turned on. Thus, a potential of the storage node Qb has a value close to the "H" potential, so that the driver transistor Qn31 is turned on, and the potential of the bit line BL1 pre-charged to the "H" level is discharged from the access transistor Qn11 through the storage node Qa and the driver transistor Qn31, to come close to an "L" potential. On the other hand, the driver transistor Qn41 is in its OFF state, because the storage node Qa has a value close to the "L" potential. Thus, the potential of the bit line BLB1 is not discharged, but kept at a value close to the "H" potential, because electric charges are supplied from the load transistor Qp21. Although not illustrated, a sense amplifier connected to the bit lines BL1, BLB1 is activated just after a difference between the potentials of the bit lines BL1, BLB1 is increased to a level capable of being amplified by the sense amplifier, so that data in the memory cell is amplified and output.

Figure 2:
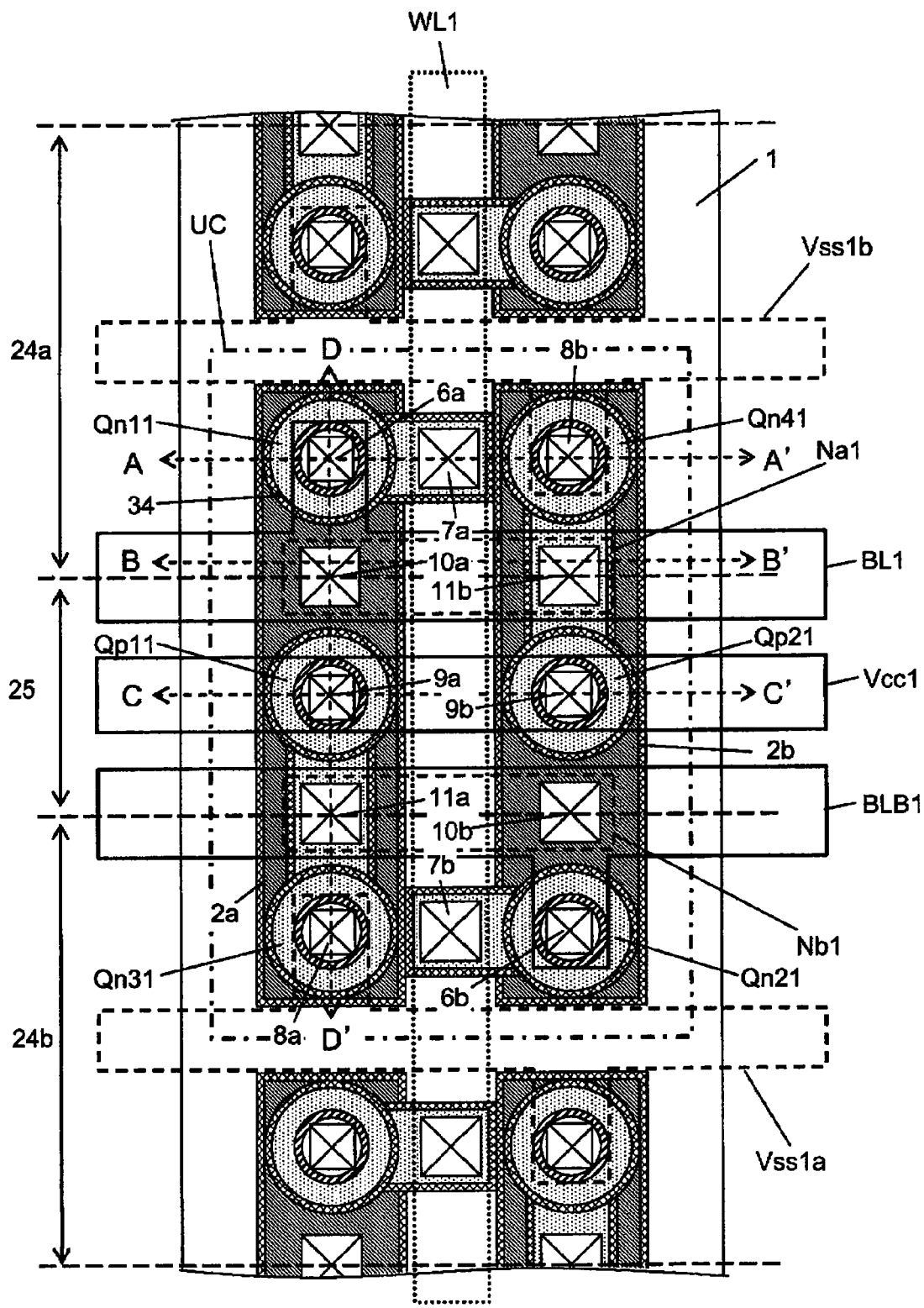
FIG. 2 is a top plan view showing the memory cell of the SRAM according to the first embodiment.

FIG. 2 illustrates a layout of the memory cell in the SRAM according to the first embodiment. In an SRAM cell array, a unit cell UC illustrated in FIG. 2 is iteratively arranged. FIGS. 3a, 3b, 3c and 3d are sectional views taken along the lines A-A', B-B', C-C' and D-D' in FIG. 2, respectively.

With reference to FIGS. 2 and 3a to 3d, the layout of the memory cell in the SRAM according to the first embodiment will be described below.

A planar silicon layer (2a, 2b) is formed on a dielectric film, such as a buried oxide film layer (BOX) 1, formed on a substrate. A planar silicon layer (2a, 2b) is formed as an $N^+$ diffusion layer (3a, 3b, 5a, 5b) and a $P^+$ diffusion layer (4a, 4b), through impurity implantation or the like, wherein the $N^+$ and $P^+$ diffusion layers formed in the same planar silicon layer are connected to each other through a silicide layer (13a, 13b) formed in a surface of the planar silicon layer (2a, 2b). The planar silicon layer (2a, 2b) serves as a storage node (Qa, Qb). In FIGS. 2 and 3a to 3d, each of Qn11 and Qn21 indicates an NMOS access transistor operable to allow access to the memory cell, and each of Qn31 and Qn41 indicates an NMOS driver transistor operable to drive the memory cell. Each of Qp11 and Qp21 indicates a PMOS load transistor operable to supply electric charges to the memory cell.

In the first embodiment, one unit cell UC comprises six transistors arranged on the buried oxide film layer 1 in a three-row by two-column array. In the 1st column, the access transistor Qn11, the load transistor Qp11 and the driver transistor Qn31 are arranged in a downward direction in FIG. 2. The diffusion layers 3a, 4a, 5a each arranged on a lowermost side of a corresponding one of Qn11, Qp11 and Qn31 serve as a first storage node Qa. In the 2nd column, the driver transistor Qn41, the load transistor Qp21 and the access transistor Qn21 are arranged in the downward direction in FIG. 2. The diffusion layers 5b, 4b, 3b each arranged on a lowermost side of a corresponding one of Qn41, Qp21 and Qn21 serve as a second storage node Qb. The SRAM cell array in the first embodiment is formed by continuously arranging the unit cell UC having the six transistors, in an upward-downward direction in FIG. 1.

A contact 10a formed on the planar silicon layer 2a is connected to a contact 11b formed on a gate line extending from respective gate electrodes of the driver transistor Qn41 and the load transistor Qp21, through a node interconnection line Na1. A contact 10b formed on the planar silicon layer 2b is connected to a contact 11a formed on a gate line extending from respective gate electrodes of the driver transistor Qn31 and the load transistor Qp11, through a node interconnection line Nb1. A contact 6a formed on a top of the access transistor Qn11 is connected to a bit line BL1, and a contact 6b formed on a top of the access transistor Qn21 is connected to a bit line BLB1. Each of a contact 7a formed on a gate line extending from a gate electrode of the access transistor Qn11 and a contact 7b formed on a gate line extending from a gate electrode of the access transistor Qn21 is connected to a word line WL1. A contact (8a, 8b) formed on a top of the driver transistor (Qn31, Qn41) is connected to an interconnection layer (Vss1a, Vss1b) having a ground potential. A contact (9a, 9b) formed on a top of the load transistor (Qp11, Qp21) is connected to an interconnection layer Vcc1 having a power supply potential.

Preferably, in order to share each of the word line, the bit lines, the power supply potential line and the ground potential line, with other memory cells, such a line is connected to each of the memory cells through a higher-level layer than the node interconnection lines to be wired in each of the memory cells.

As one example of the hierarchical wiring configuration, it is contemplated that the node interconnection line (Na1, Nb1) and the ground potential line (Vss1a, Vss1b) are wired in a lower-level layer than the bit line (BL1, BLB1) and the power supply potential line, and the word line (WL1) is wired in a higher-level layer than the bit line (BL1, BLB1) and the power supply potential line, to keep each line from coming in contact with an unintended one of the contacts.

An $N^+$ implantation zone (24a, 24b) and a $P^+$ implantation zone 25 are illustrated in FIG. 2. In the first embodiment, a pattern for defining the $N^+$ implantation zone (24a, 24b) and the $P^+$ implantation zone 25 in an SRAM cell array region is formed by simple lines and spaces. This makes it possible to reduce an impact of dimension error and alignment error to minimize a dimensional margin around a boundary between the $N^+$ implantation zone and the $P^+$ implantation zone. Specifically, in FIG. 2, a length of the SRAM cell in a longitudinal direction thereof (in a connection direction of the SRAM cells) can be effectively reduced.

In the first embodiment, the storage nodes and the gate lines are formed only in a rectangular shape. This makes it possible to easily correct a pattern shape by OPC (optical Proximity Correction), and provide a layout suitable for achieving a sufficiently-small SRAM cell area.

In the first embodiment, a source and a drain in each of the transistors constituting the SRAM are defined as follows. In regard to the driver transistor (Qn31, Qn41), the diffusion layer formed in an upper portion of the pillar-shaped semiconductor layer and connected to the ground potential is defined as a source diffusion layer, and the diffusion layer formed underneath the pillar-shaped semiconductor layer is defined as a drain diffusion layer. In regard to the load transistor (Qp11, Qp21), the diffusion layer formed in an upper portion of the pillar-shaped semiconductor layer and connected to the power supply potential is defined as a source diffusion layer, and the diffusion layer formed underneath the pillar-shaped semiconductor layer is defined as a drain diffusion layer. In regard to the access transistor (Qn11, Qn21), although each of the diffusion layer formed in an upper portion of a pillar-shaped semiconductor layer and the diffusion layer formed underneath the pillar-shaped semiconductor layer serves as a source or a drain depending on an operating state, the diffusion layer formed in the upper portion of the pillar-shaped semiconductor layer and the diffusion layer formed underneath the pillar-shaped semiconductor layer are defined, respectively, as a source diffusion layer and a drain diffusion layer, for descriptive purposes.

Figure 3A:
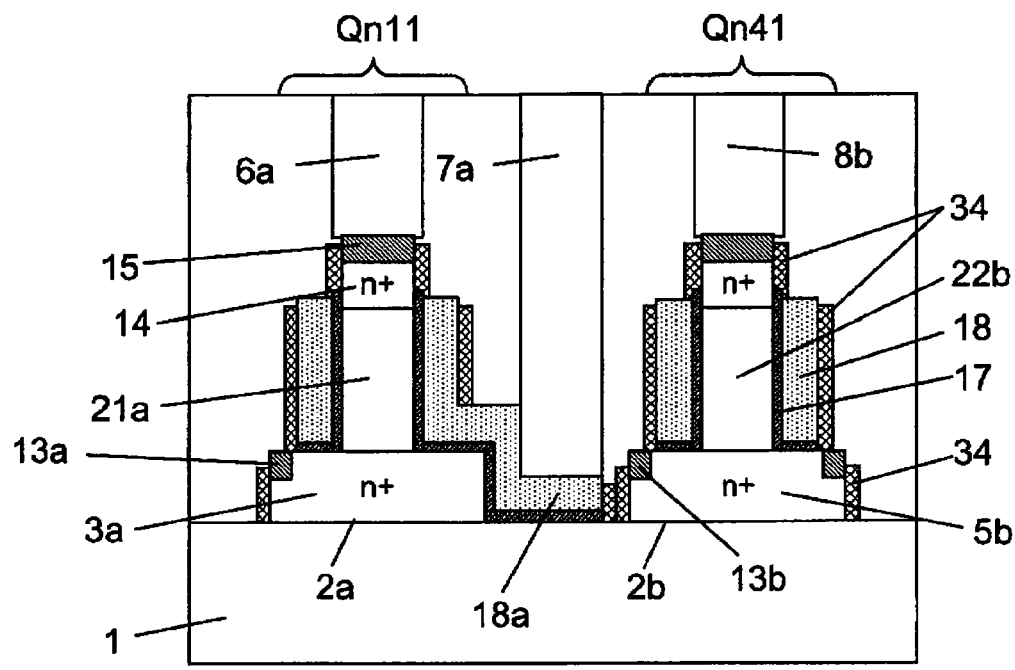
FIG. 3a is a sectional view showing the memory cell of the SRAM according to the first embodiment.

With reference to the section views of FIGS. 3a to 3d, a structure of the SRAM according to the first embodiment will be described below. As shown in FIG. 3a, a planar silicon layer (2a, 2b) serving as a storage node is formed on a buried oxide film layer (BOX) 1, and an $N^+$ drain diffusion layer (3a, 5b) is formed in the planar silicon layer (2a, 2b) by impurity implantation or the like. An element isolation region for isolating between the planar silicon layers 2a, 2b can be formed simply by dividing a continuous planar silicon layer 2 into two pieces by etching. Thus, the element isolation region can be formed in a minimum fabrication size through a process having a less number of steps. A silicide layer (13a, 13b) is formed in a surface of the $N^+$ drain diffusion layer (3a, 5b). A pillar-shaped silicon layer 21a constituting an access transistor Qn11 is formed on the $N^+$ drain diffusion layer 3a, and a pillar-shaped silicon layer 22b constituting a driver transistor Qn41 is formed on the $N^+$ drain diffusion layer 5b. A gate dielectric film 17 and a gate electrode 18 are formed around each of the pillar-shaped silicon layers. An $N^+$ source diffusion layer 14 is formed in an upper portion of the pillar-shaped silicon layer (21a, 22b) by impurity implantation or the like, and a silicide layer 15 is formed in a surface of the source diffusion layer 14. A contact 6a formed on the access transistor Qn11 is connected to a bit line BL1, and a contact 7a formed on a gate line 18a extending from the gate electrode 18 of the access transistor Qn11 is connected to a word line WL1. A contact 8b formed on the driver transistor Qn41 is connected to a ground potential line Vss1b.

Figure 3B:
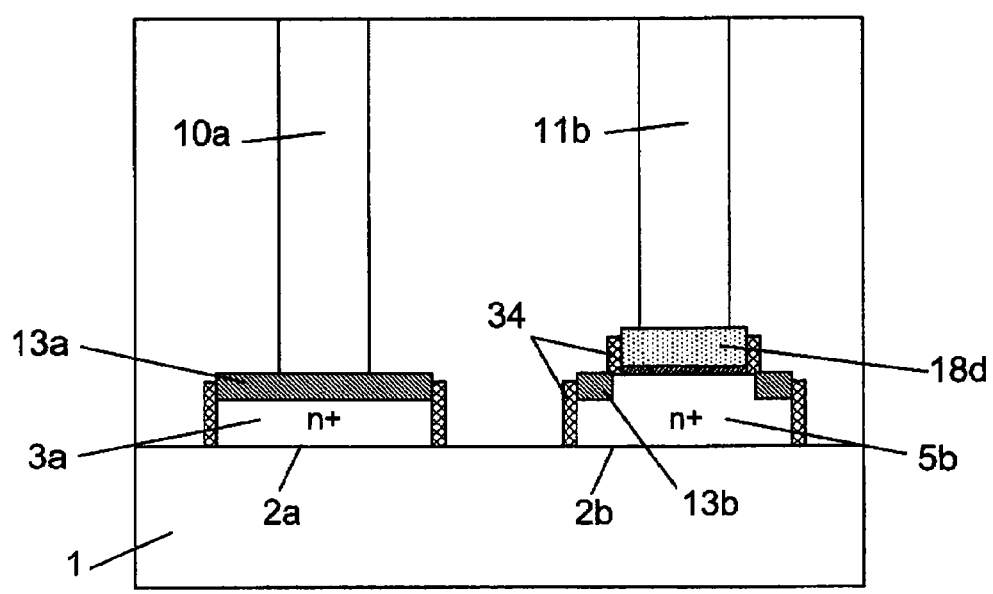
FIG. 3b is a sectional view showing the memory cell of the SRAM according to the first embodiment.

As shown in FIG. 3b, the planar silicon layer (2a, 2b) serving as a storage node is formed on the buried oxide film layer (BOX) 1, and the $N^+$ drain diffusion layer (3a, 5b) is formed in the planar silicon layer (2a, 2b) by impurity implantation or the like. The silicide layer (13a, 13b) is formed in the surface of the $N^+$ drain diffusion layer (3a, 5b). A contact 10a is formed on the drain diffusion layer 3a at a boundary between the $N^+$ drain diffusion layer 3a and the P+ drain diffusion layer 4a, and connected to a contact 11b formed on a gate line 18d extending from the respective gate electrodes of the driver transistor Qn41 and the load transistor Qp21, through a storage node interconnection line Na1.

Figure 3C:
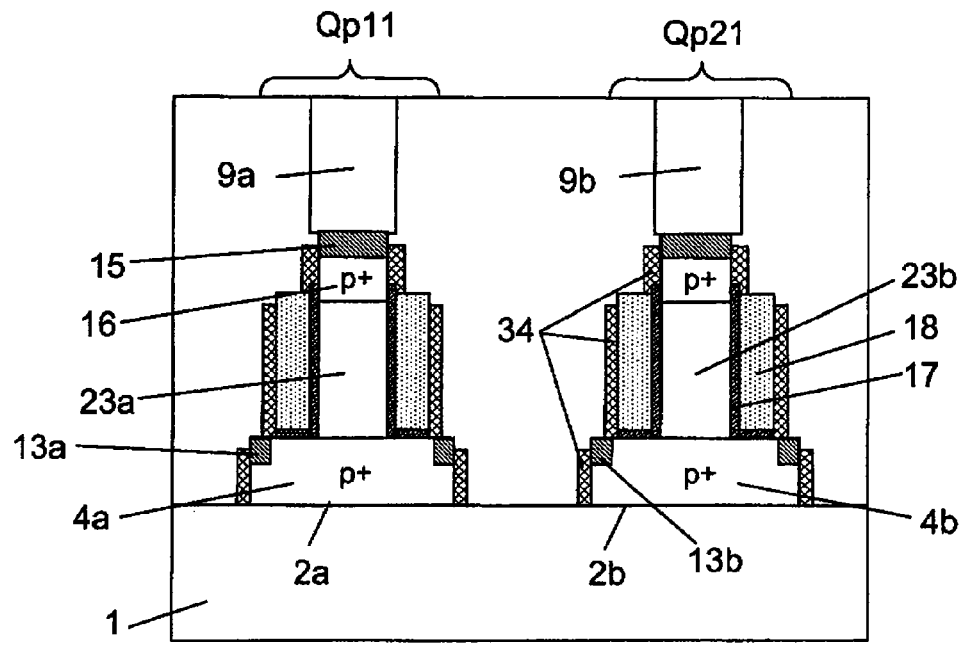
FIG. 3c is a sectional view showing the memory cell of the SRAM according to the first embodiment.

As shown in FIG. 3c, the planar silicon layer (2a, 2b) serving as a storage node is formed on the buried oxide film layer (BOX) 1, and a $P^+$ drain diffusion layer (4a, 4b) is formed in the planar silicon layer (2a, 2b) by impurity implantation or the like. The silicide layer (13a, 13b) is formed in a surface of the $P^+$ drain diffusion layer (4a, 4b). A pillar-shaped silicon layer 23a constituting a load transistor Qp11 is formed on the $P^+$ drain diffusion layer 4a, and a pillar-shaped silicon layer 23b constituting a load transistor Qp21 is formed on the $P^+$ drain diffusion layer 4b. The gate dielectric film 17 and the gate electrode 18 are formed around each of the pillar-shaped silicon layers. A $P^+$ source diffusion layer 16 is formed in an upper portion of the pillar-shaped silicon layer (23a, 23b) by impurity implantation or the like, and the silicide layer 15 is formed in a surface of the source diffusion layer 16. A contact (9a, 9b) formed on the load transistor (Qp11, Qp21) is connected to a power supply potential line Vcc1 through an interconnection layer.

Figure 3D:
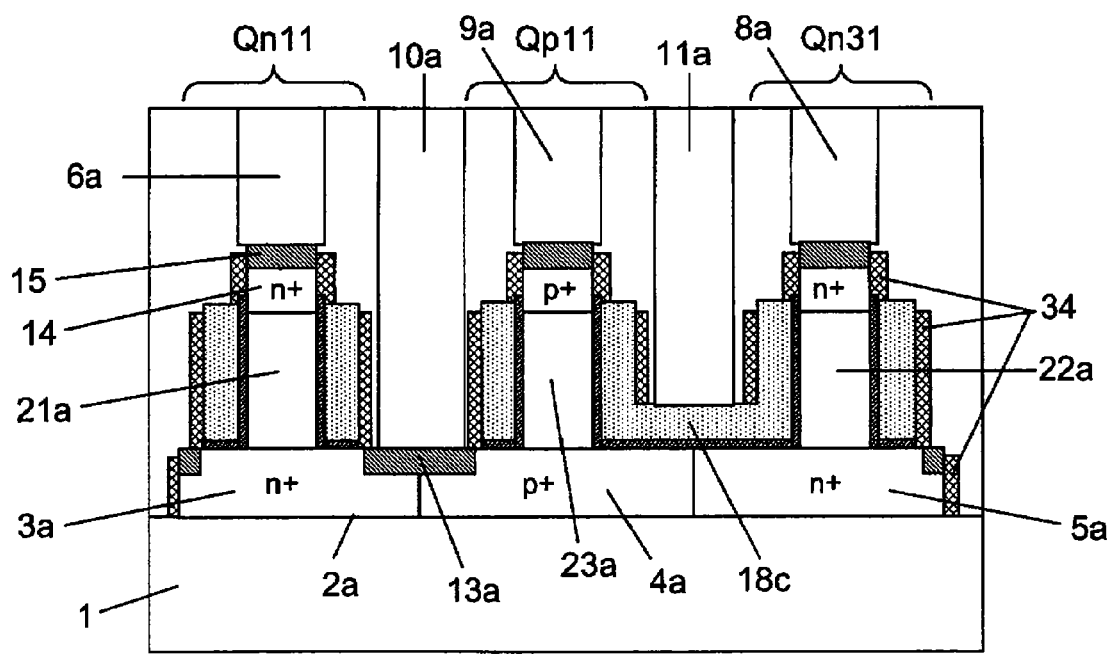
FIG. 3d is a sectional view showing the memory cell of the SRAM according to the first embodiment.
Figure 4:
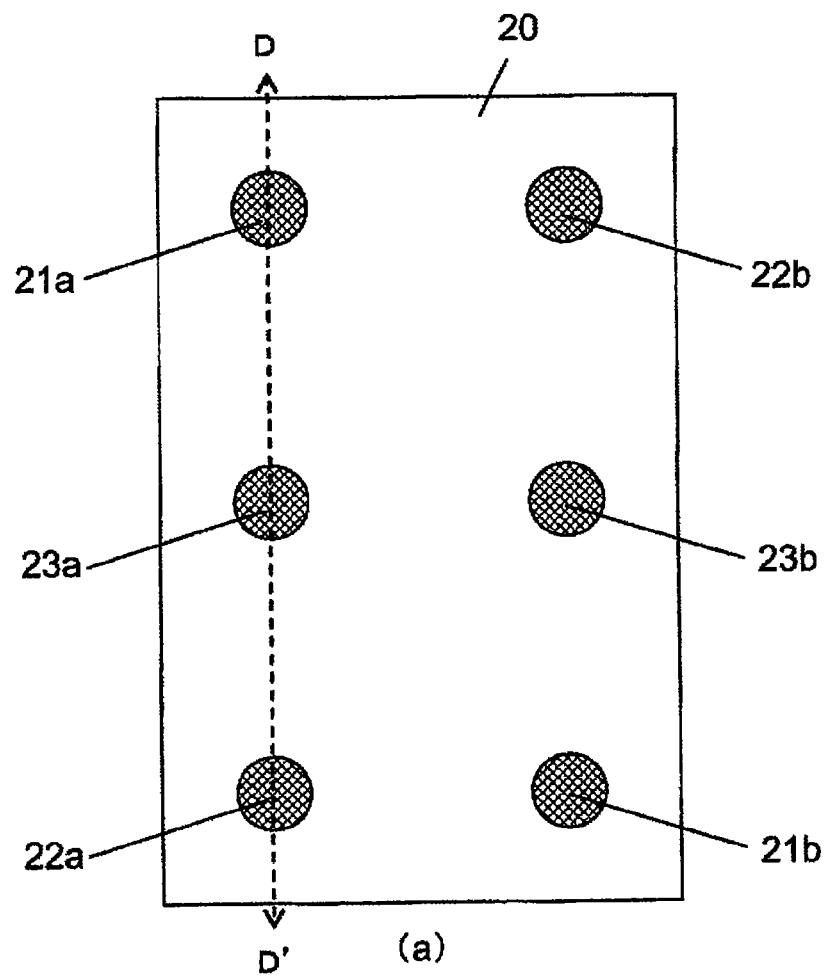
FIGS. 4(a) and 4(b) are process diagrams showing a production process of the SRAM according to the first embodiment, on a step-by-step basis.
Figure 4:
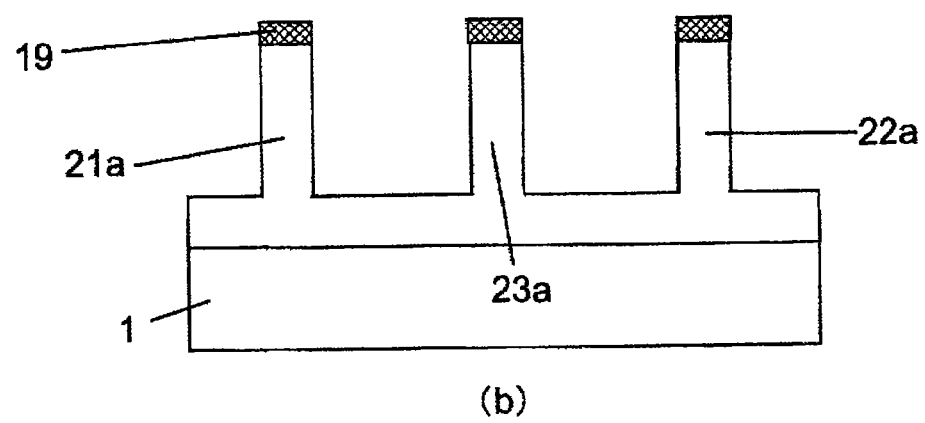
Figure 5:
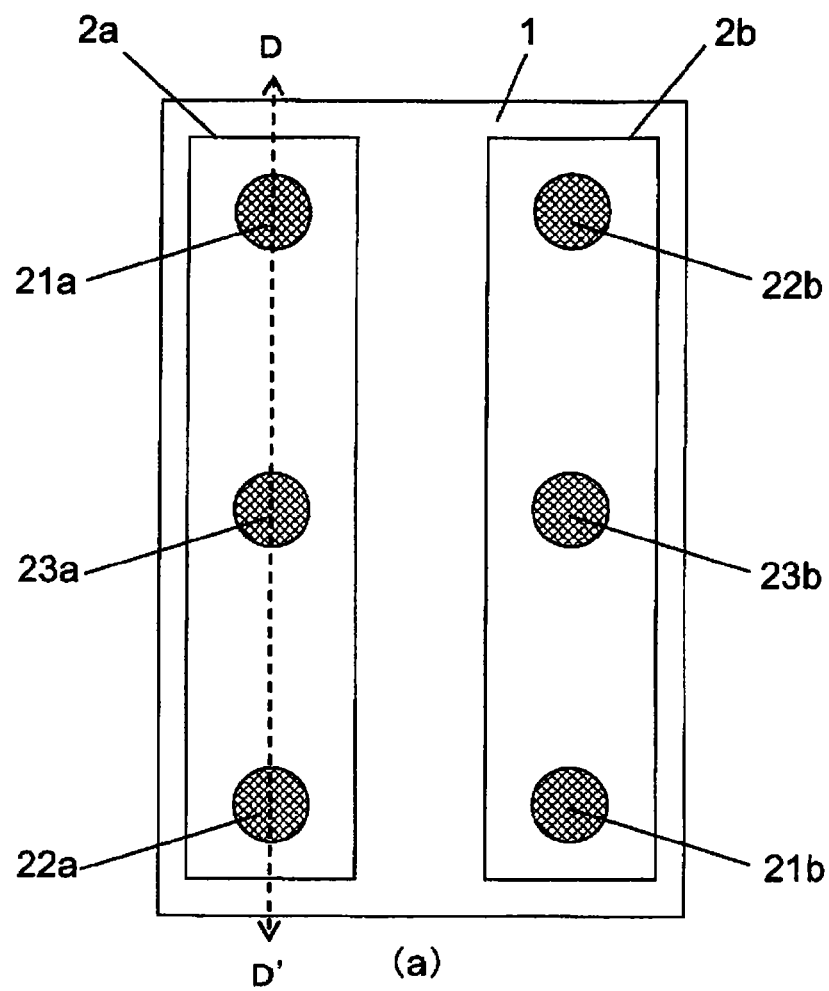
FIGS. 5(a) and 5(b) are process diagrams showing the production process of the SRAM according to the first embodiment, on a step-by-step basis.
Figure 5:
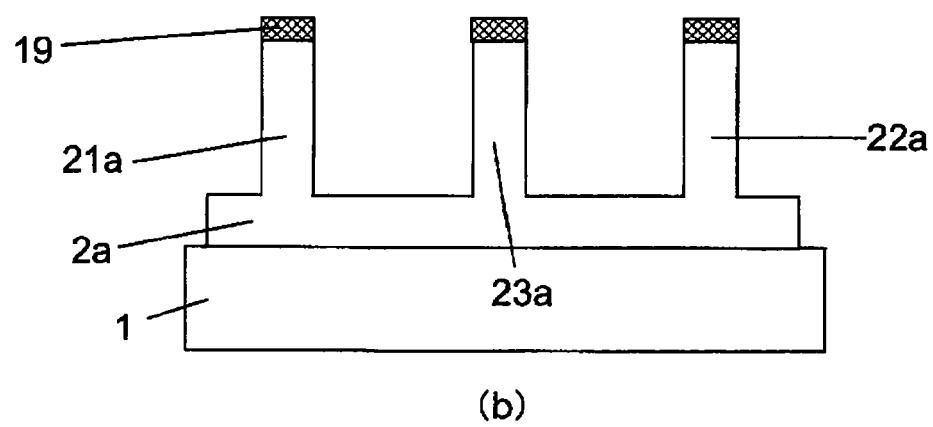
Figure 6:
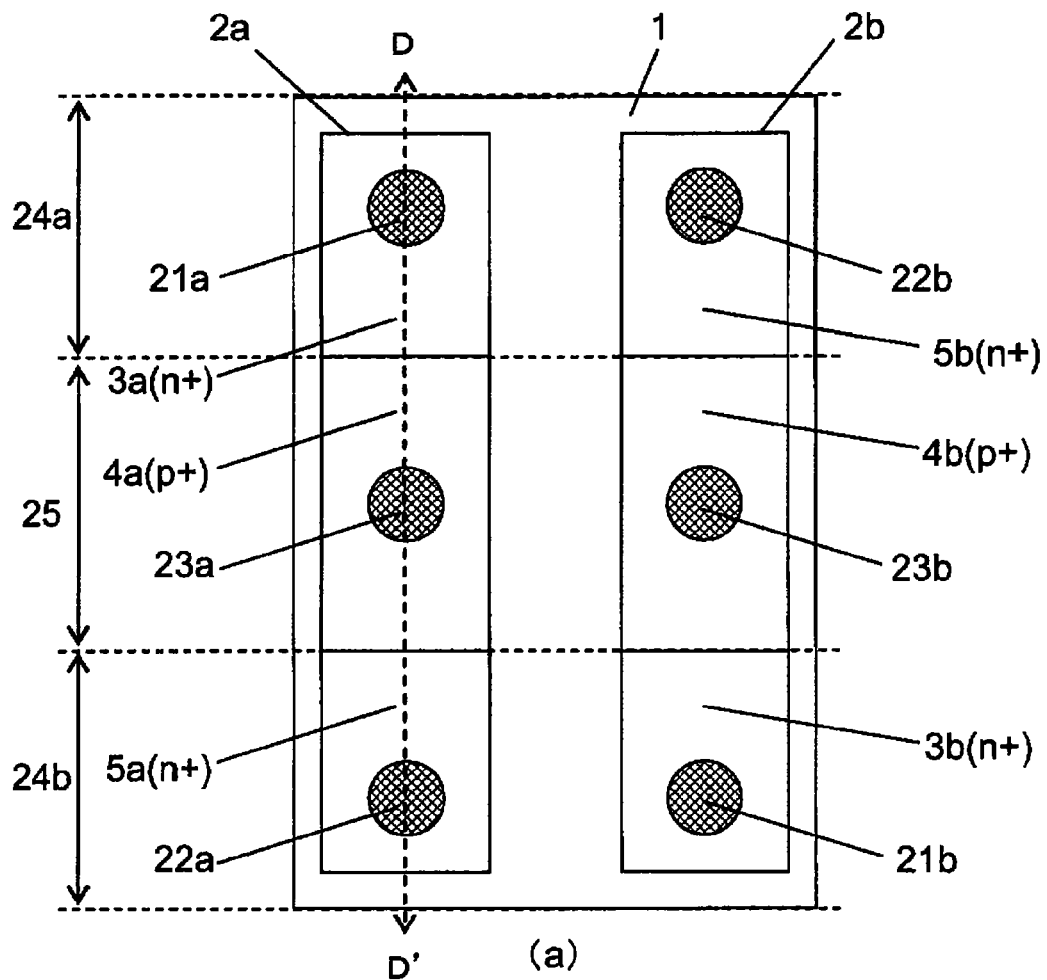
FIGS. 6(a) and 6(b) are process diagrams showing the production process of the SRAM according to the first embodiment, on a step-by-step basis.
Figure 6:
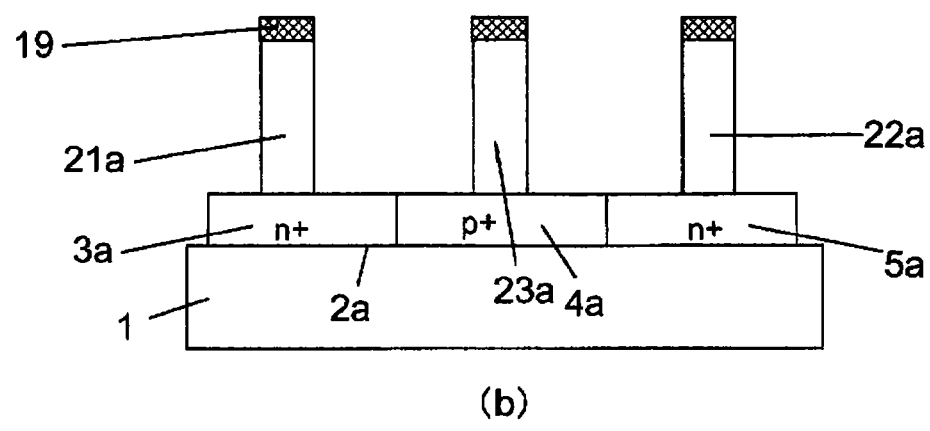
Figure 7:
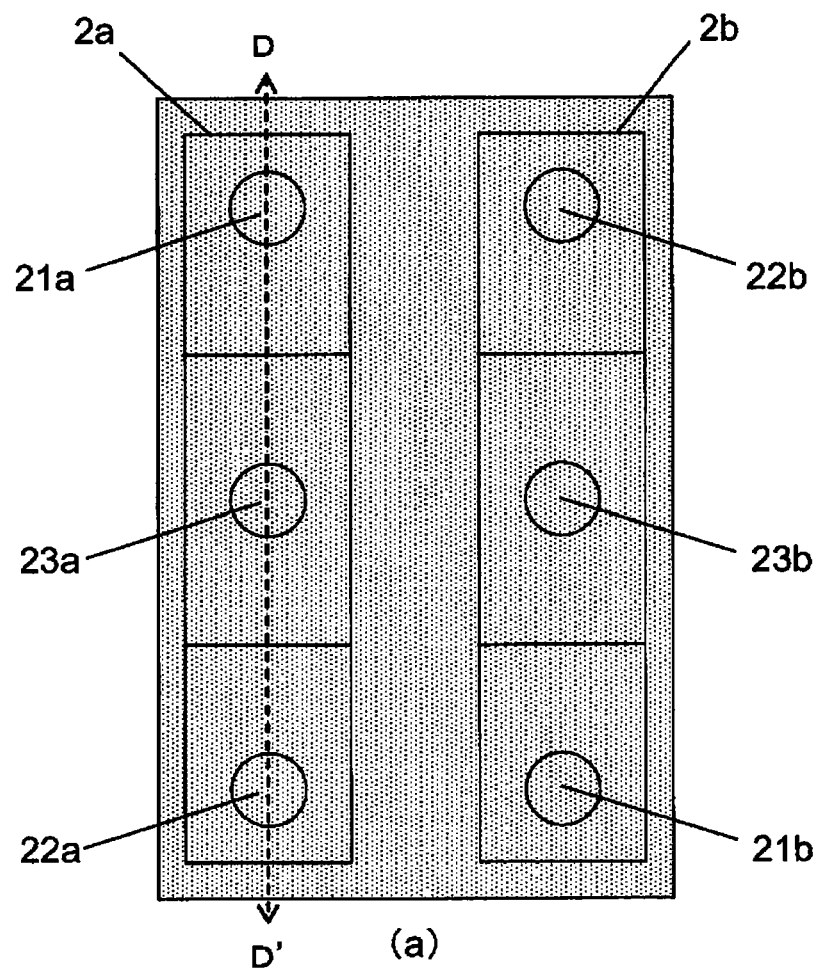
FIGS. 7(a) and 7(b) are process diagrams showing the production process of the SRAM according to the first embodiment, on a step-by-step basis.
Figure 7:
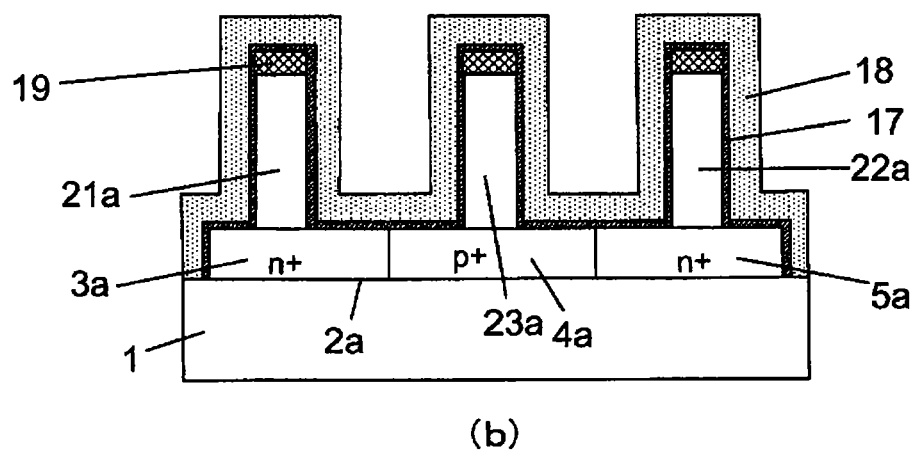
Figure 8:
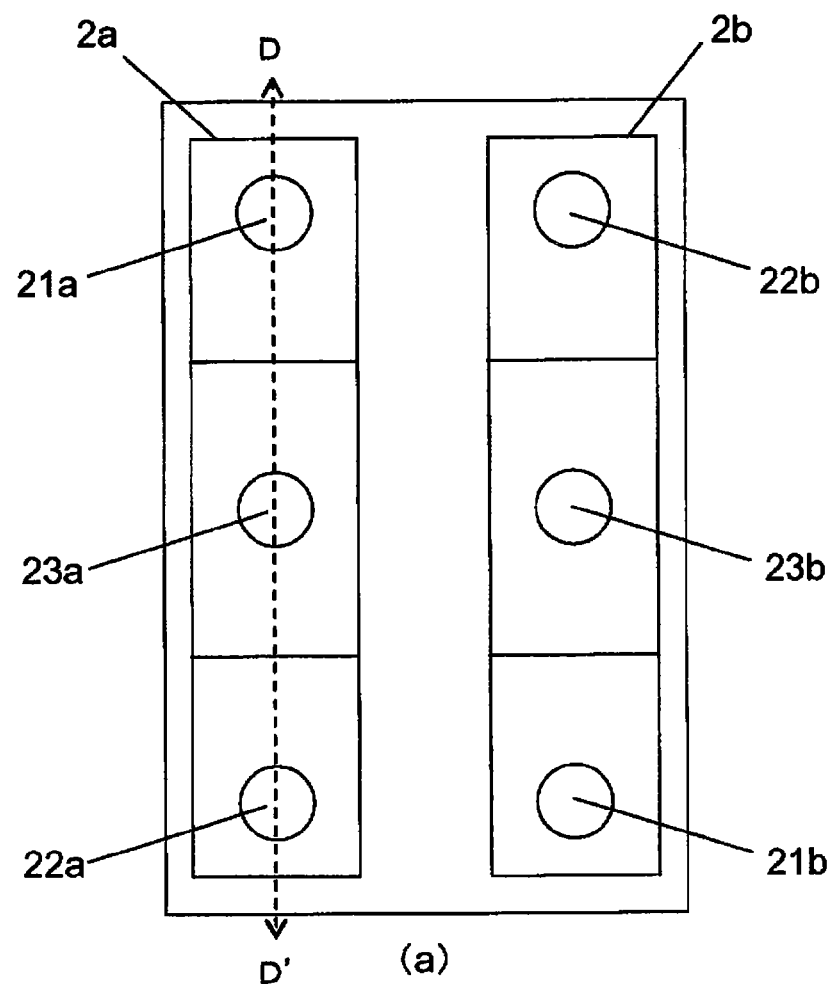
FIGS. 8(a) and 8(b) are process diagrams showing the production process of the SRAM according to the first embodiment, on a step-by-step basis.
Figure 8:
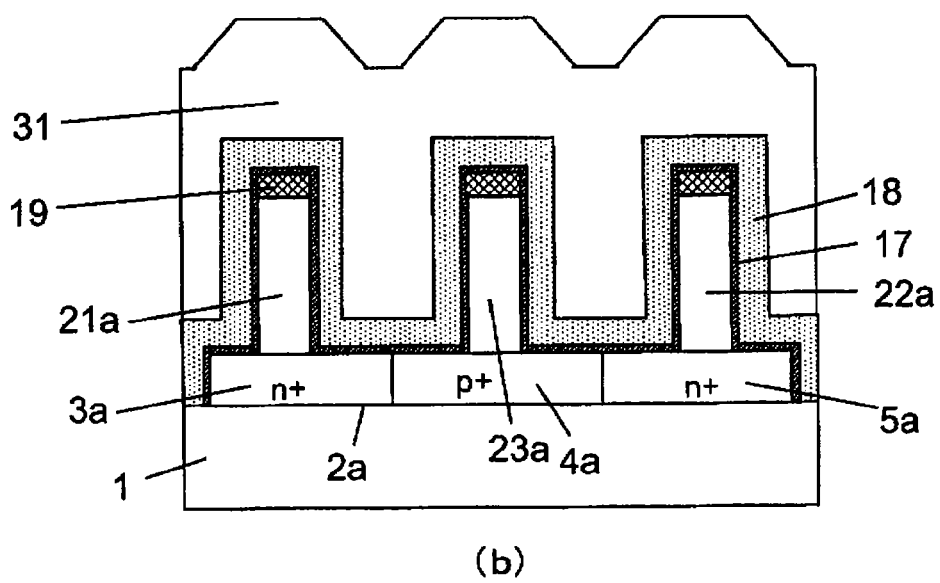
Figure 9:
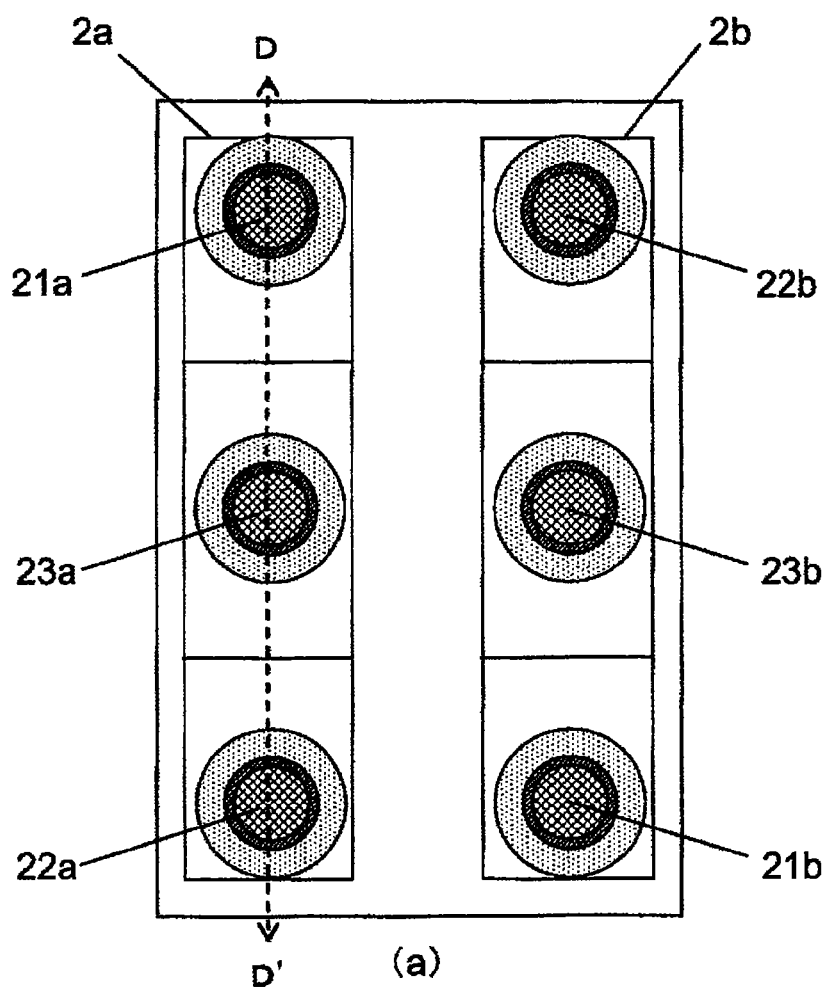
FIGS. 9(a) and 9(b) are process diagrams showing the production process of the SRAM according to the first embodiment, on a step-by-step basis.
Figure 9:
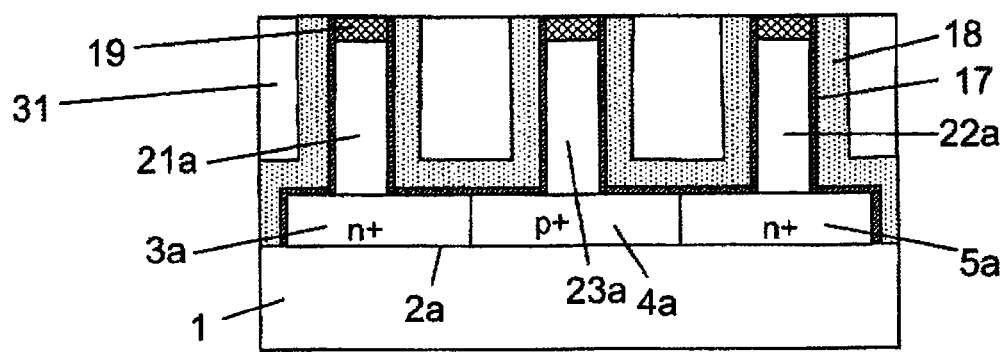
Figure 10:
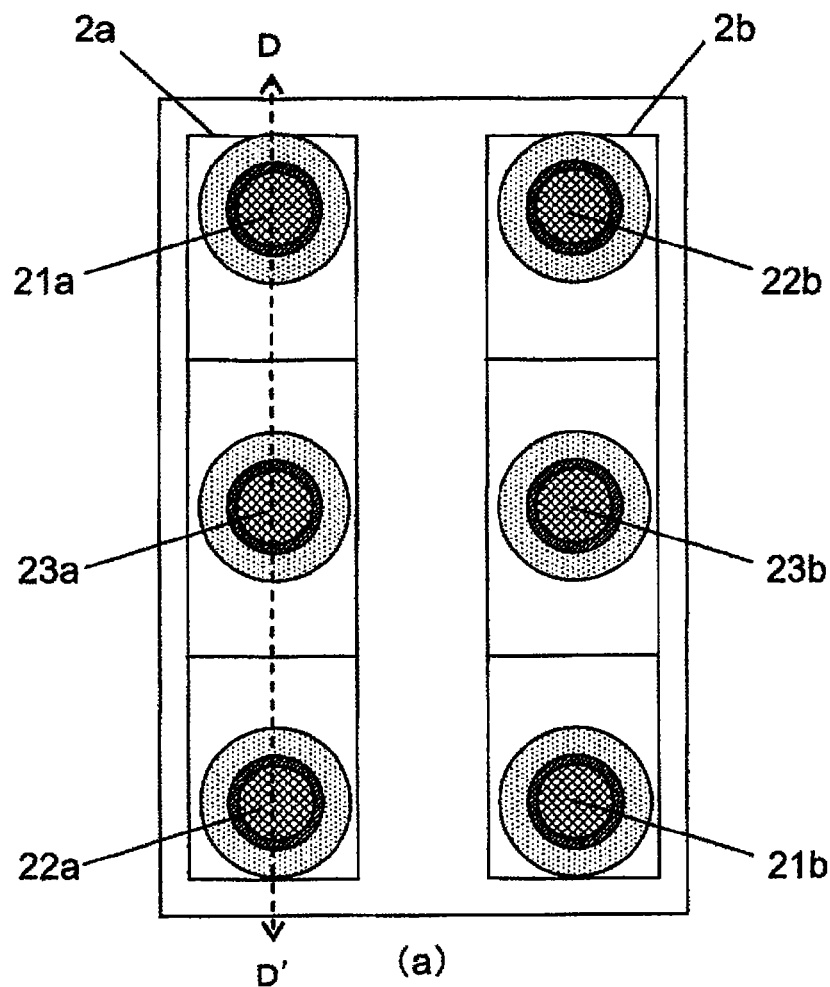
FIGS. 10(a) and 10(b) are process diagrams showing the production process of the SRAM according to the first embodiment, on a step-by-step basis.
Figure 10:
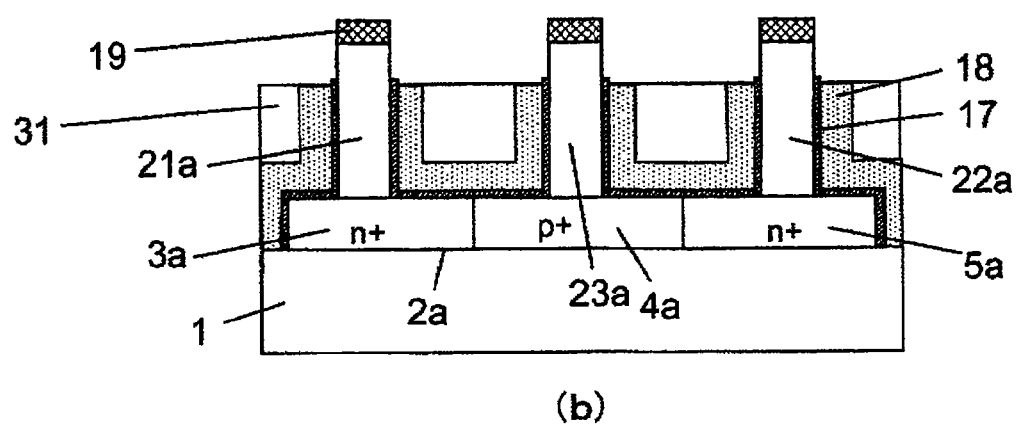
Figure 11:
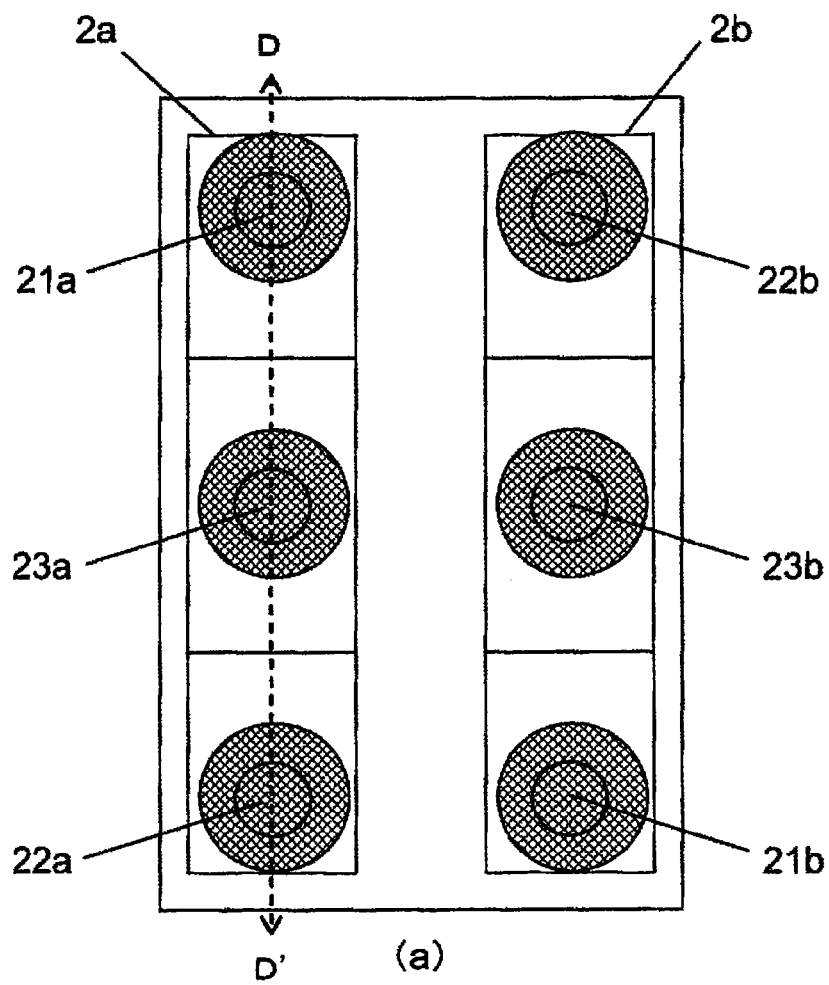
FIGS. 11(a) and 11(b) are process diagrams showing the production process of the SRAM according to the first embodiment, on a step-by-step basis.
Figure 11:
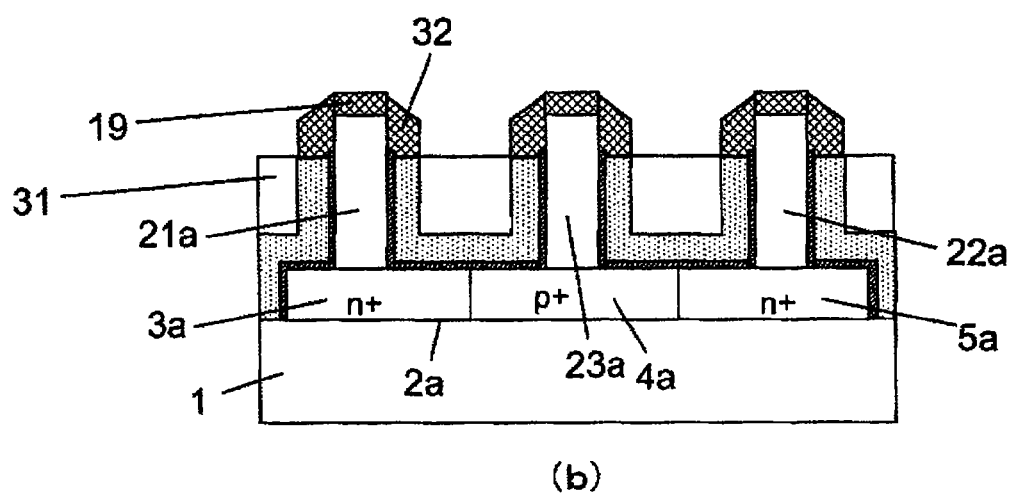
Figure 12:
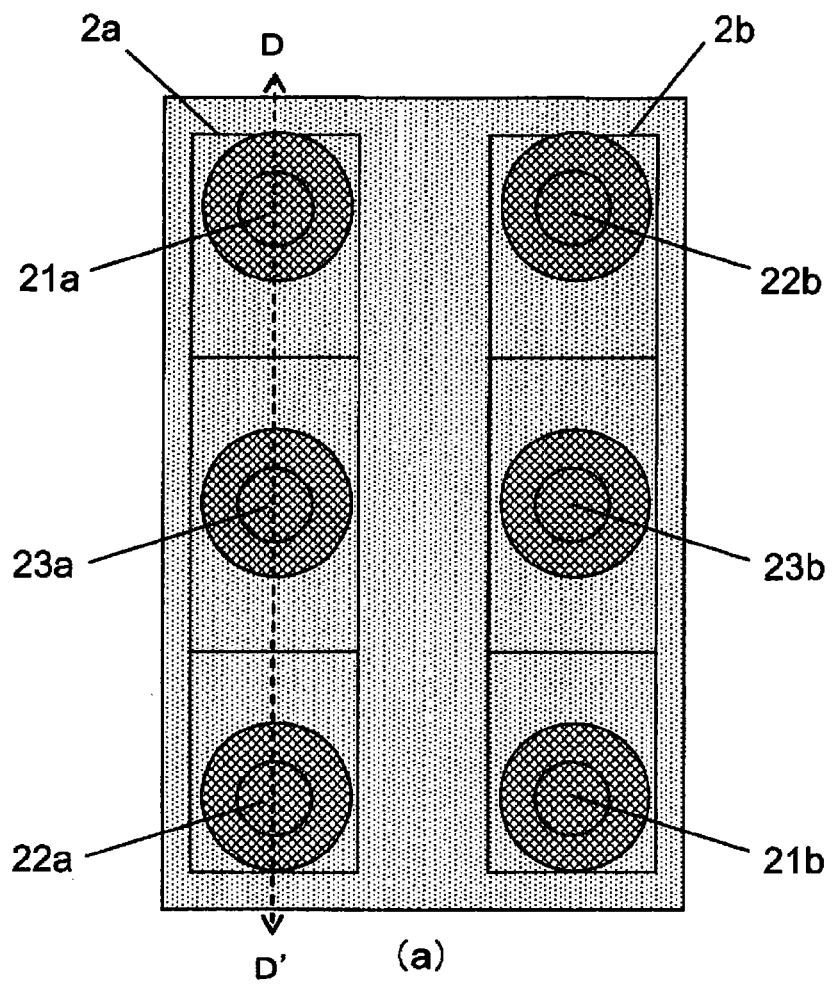
FIGS. 12(a) and 12(b) are process diagrams showing the production process of the SRAM according to the first embodiment, on a step-by-step basis.
Figure 12:
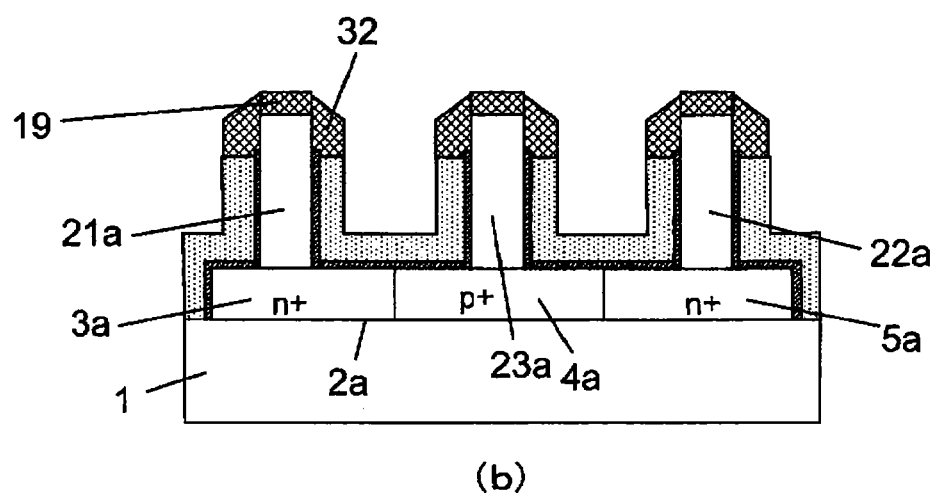
Figure 13:
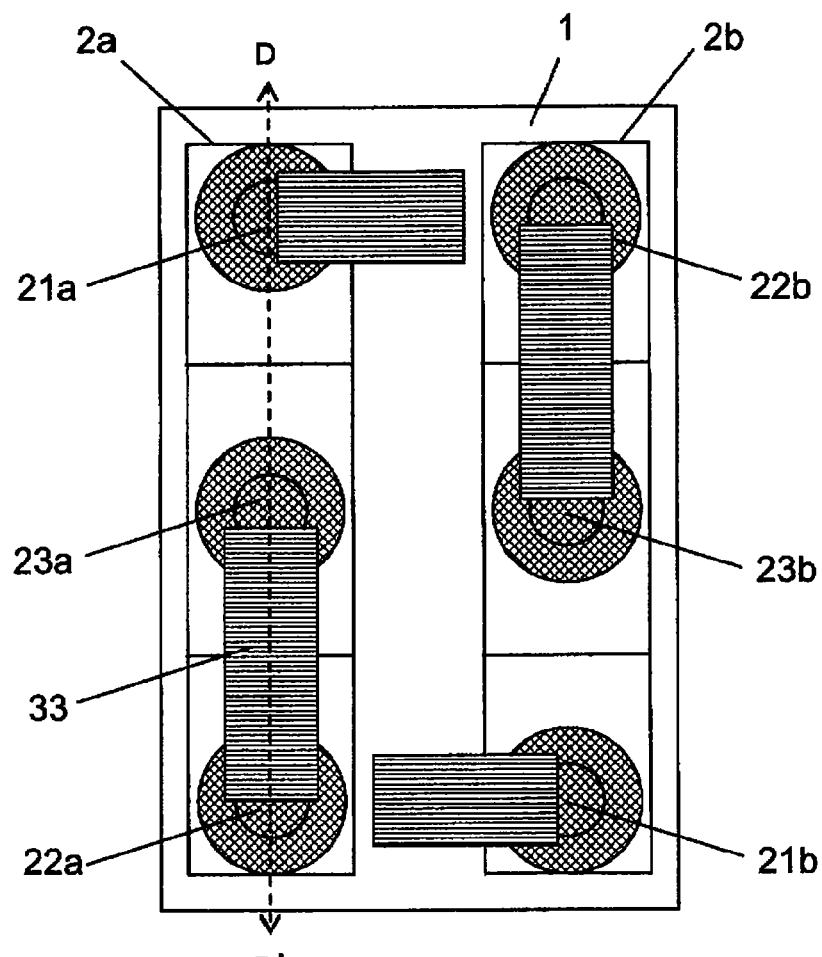
FIGS. 13(a) and 13(b) are process diagrams showing the production process of the SRAM according to the first embodiment, on a step-by-step basis.
Figure 13:
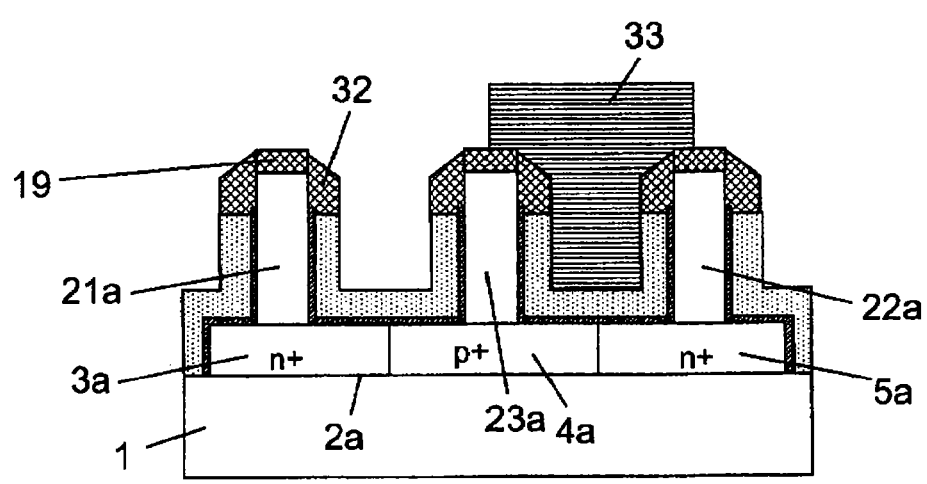
Figure 14:
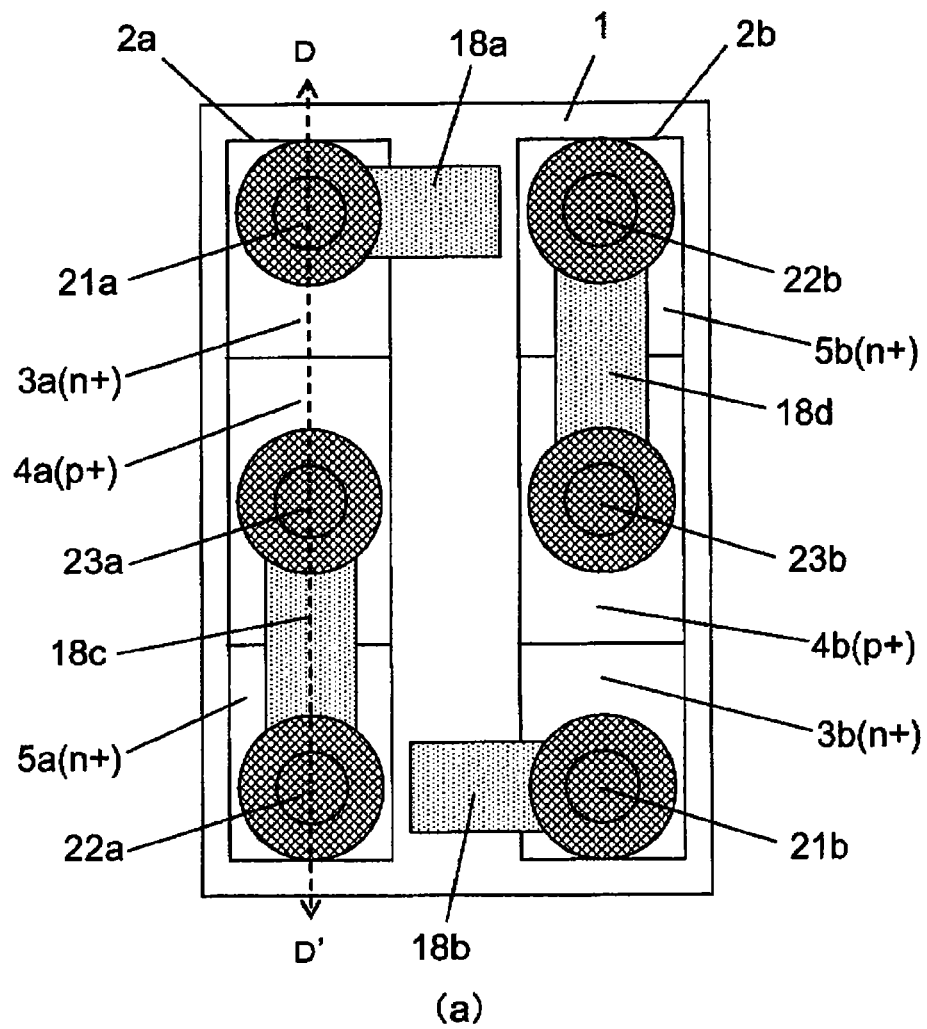
FIGS. 14(a) and 14(b) are process diagrams showing the production process of the SRAM according to the first embodiment, on a step-by-step basis.
Figure 14:
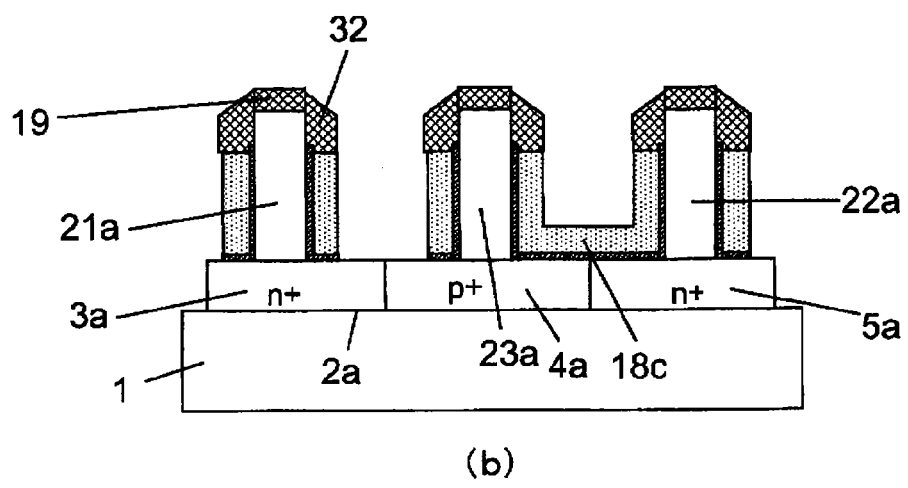
Figure 15:
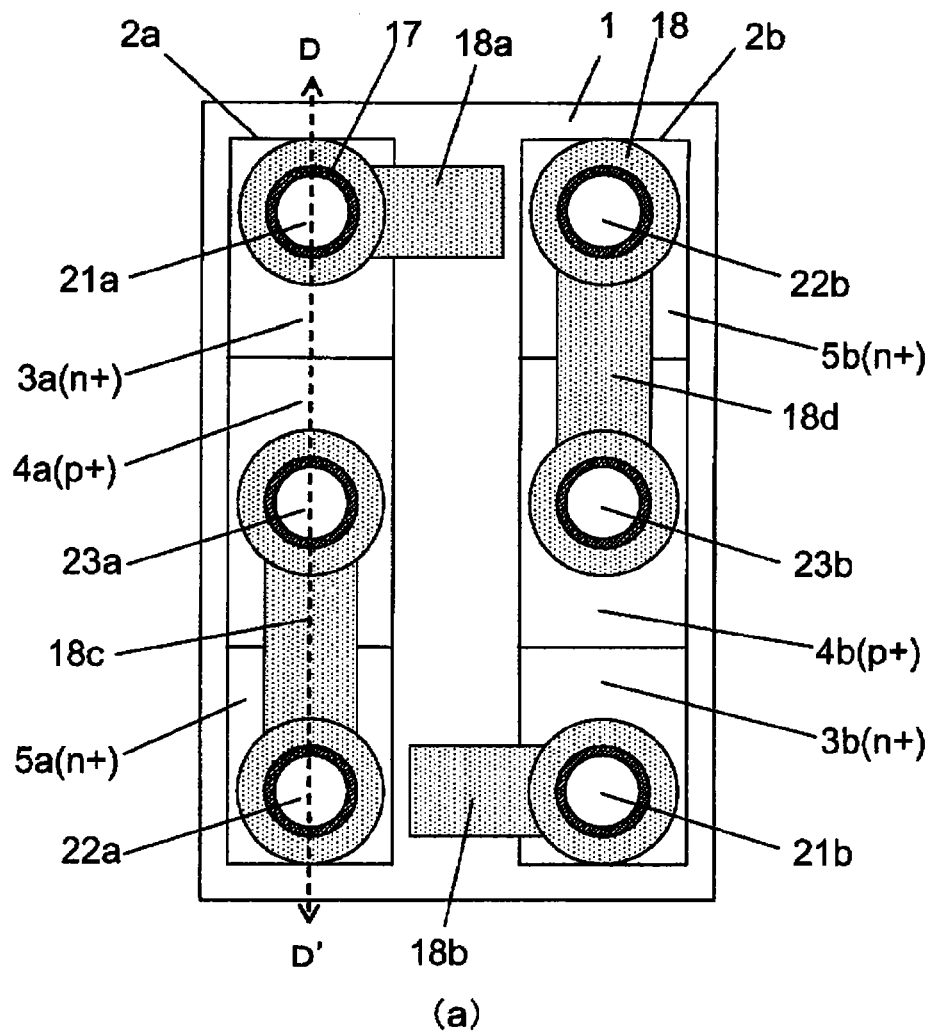
FIGS. 15(a) and 15(b) are process diagrams showing the production process of the SRAM according to the first embodiment, on a step-by-step basis.
Figure 15:
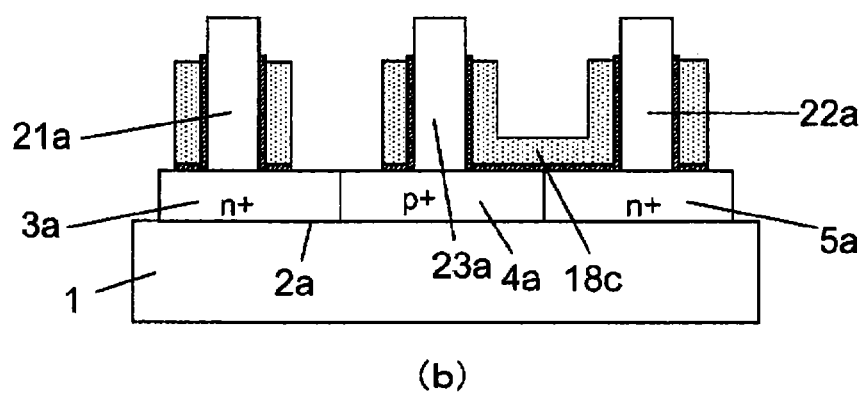
Figure 16:
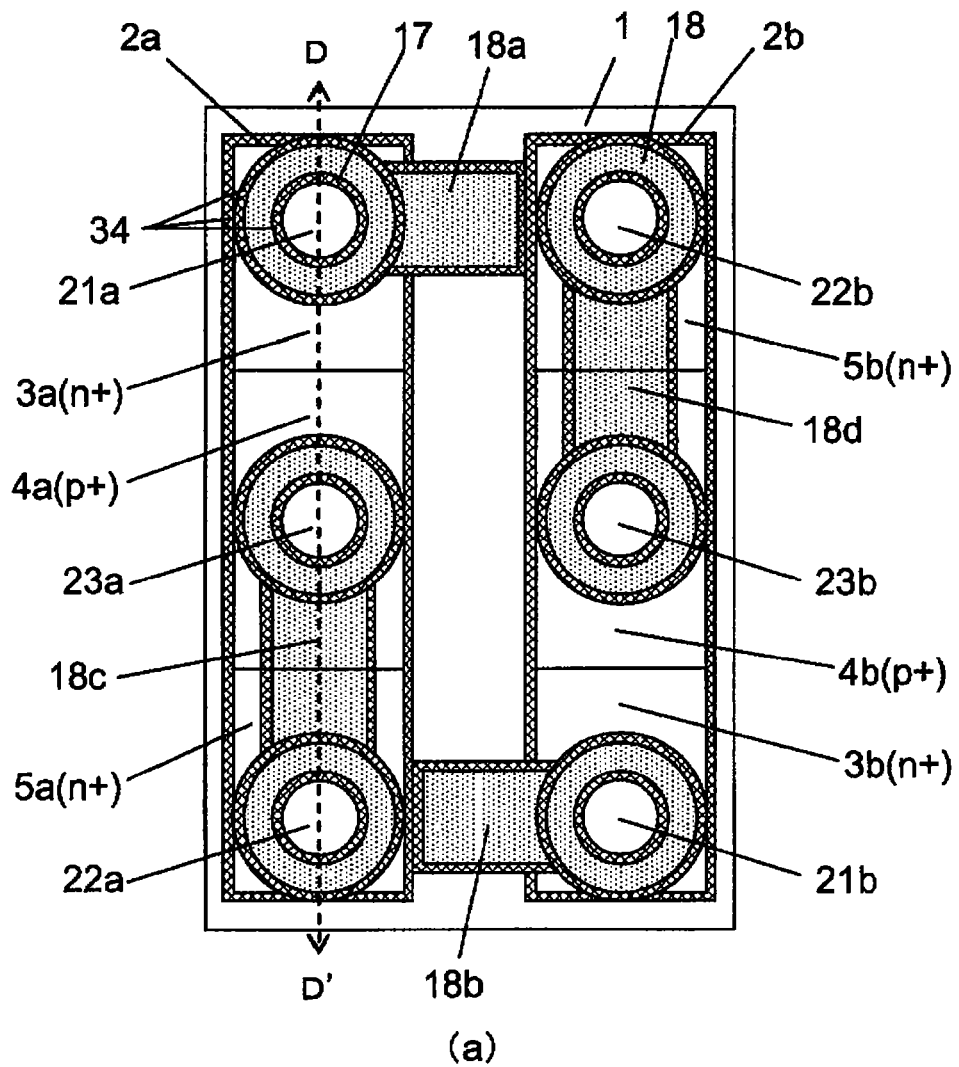
FIGS. 16(a) and 16(b) are process diagrams showing the production process of the SRAM according to the first embodiment, on a step-by-step basis.
Figure 16:
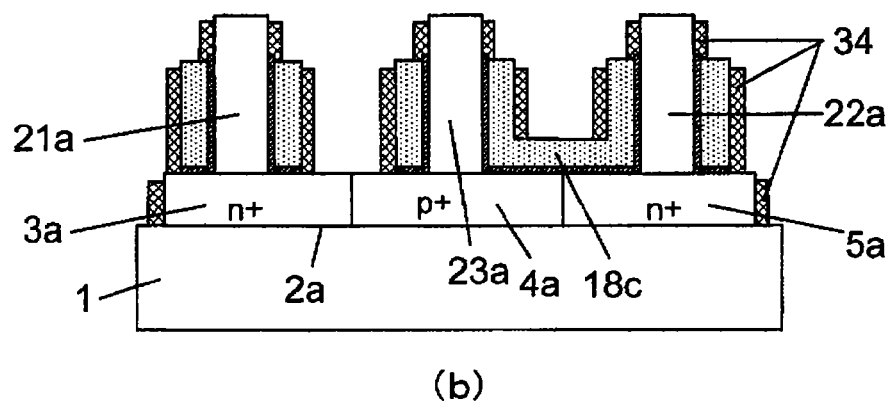
Figure 17:
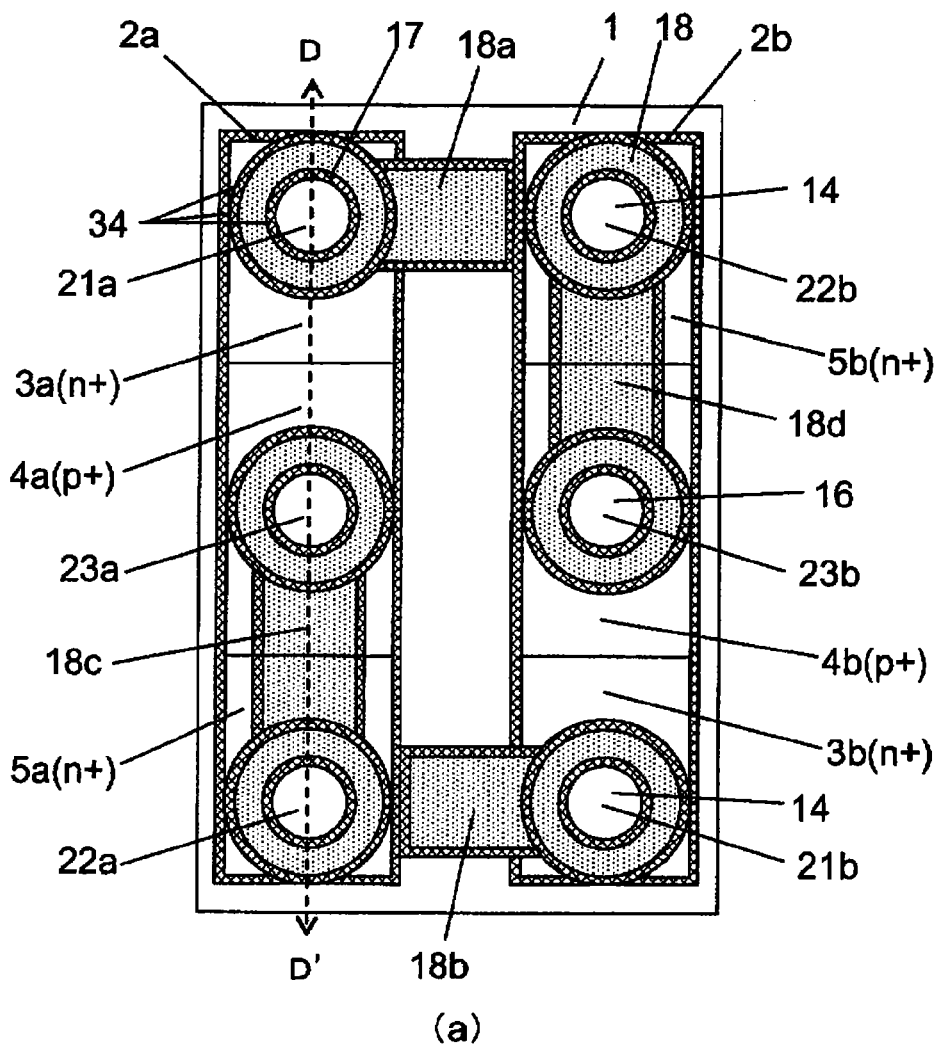
FIGS. 17(a) and 17(b) are process diagrams showing the production process of the SRAM according to the first embodiment, on a step-by-step basis.
Figure 17:
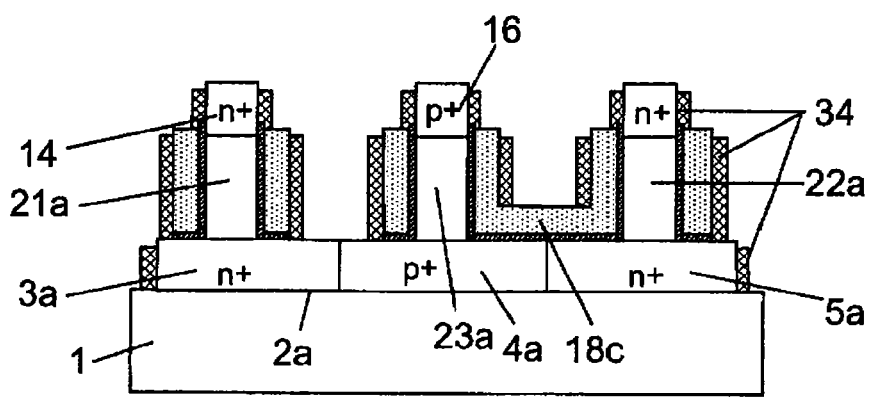
Figure 18:
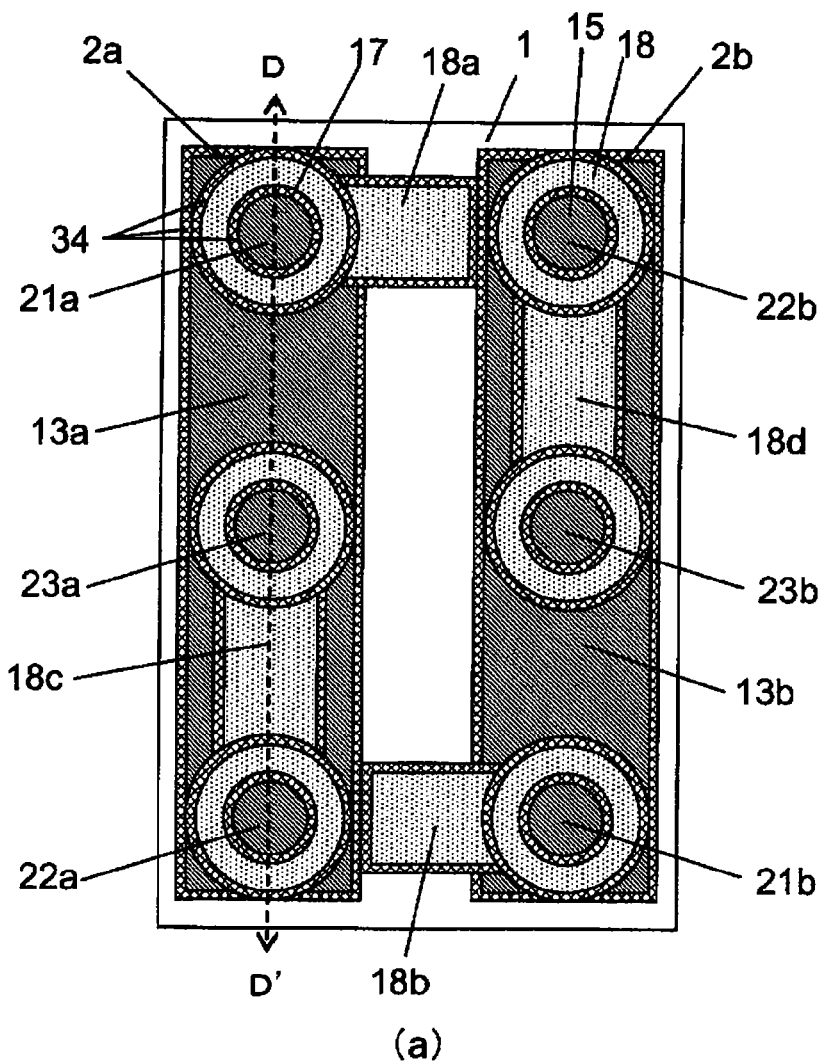
FIGS. 18(a) and 18(b) are process diagrams showing the production process of the SRAM according to the first embodiment, on a step-by-step basis.
Figure 18:
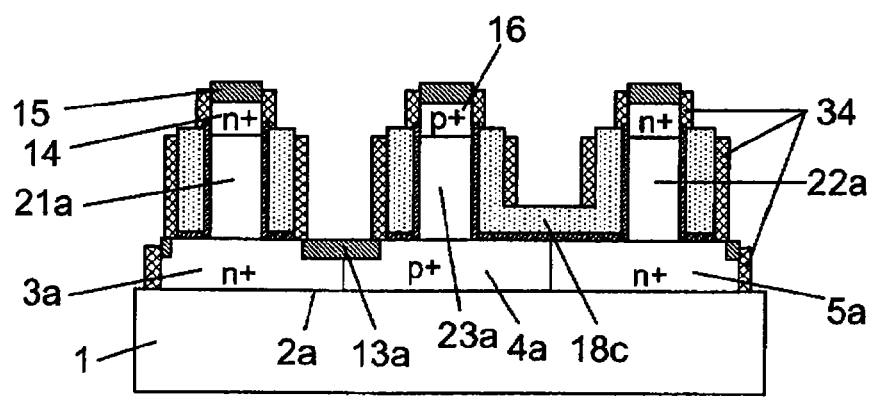
Figure 19:
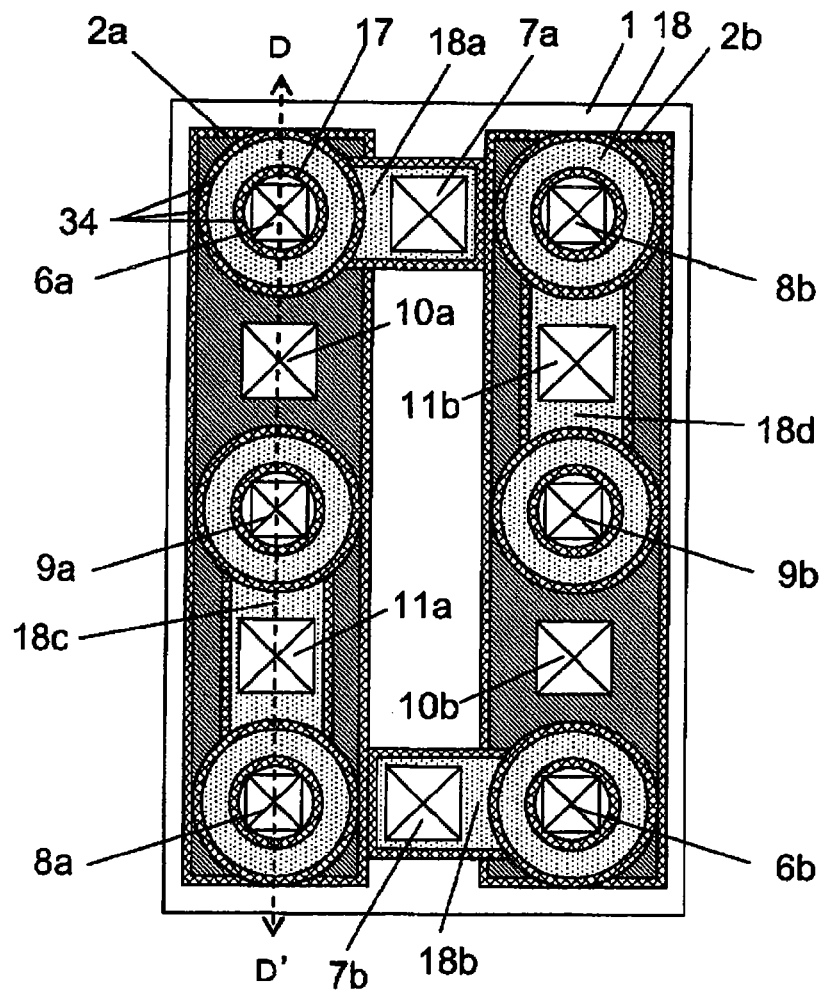
FIGS. 19(a) and 19(b) are process diagrams showing the production process of the SRAM according to the first embodiment, on a step-by-step basis.
Figure 19:
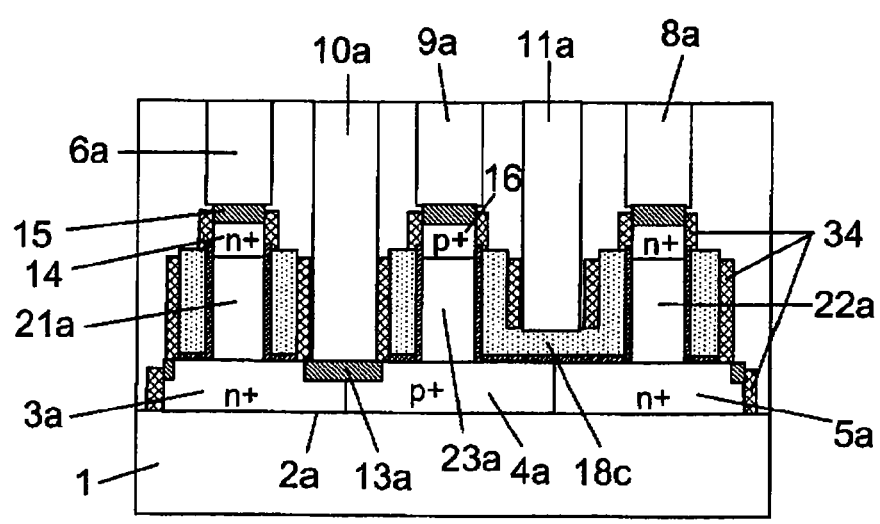

As shown in FIG. 3d, the planar silicon layer 2a serving as a storage node is formed on the buried oxide film layer (BOX) 1, and the $N^+$ drain diffusion layer 3a, the $P^+$ drain diffusion layer 4a and an $N^+$ drain diffusion layer 5a are formed in the planar silicon layer 2a by impurity implantation or the like. The silicide layer 13a is formed in the surface of the $N^+$ drain diffusion layer (3a, 5a) and the $P^+$ drain diffusion layer 4a, so that the $N^+$ drain diffusion layer (3a, 5a) and the $P^+$ drain diffusion layer 4a are directly connected to each other. Thus, there is no necessity to form an element isolation region for isolating between the $N^+$ and $P^+$ drain diffusion layers and a contact for connecting the N+ and P+ drain diffusion layers. This is effective to reduce a memory cell area.

The pillar-shaped silicon layer 21a constituting the access transistor Qn11, a pillar-shaped silicon layer 22a constituting a driver transistor Qn31, and the pillar-shaped silicon layer 23a constituting the load transistor Qp11, are formed on the N+ drain diffusion layer 3a, the N+ drain diffusion layer 5a and the P+ drain diffusion layer 4a, respectively. The N+ drain diffusion layer 3a, the P+ drain diffusion layer 4a and the N+ drain diffusion layer 5a are directory connected to each other through the silicide layer 13a formed in a surface of the planar silicon layer 2a. The gate dielectric film 17 and the gate electrode 18 are formed around each of the pillar-shaped silicon layers. The source diffusion layer is formed in the upper portion of each of the pillar-shaped silicon layers by impurity implantation or the like, and the silicide layer 15 is formed in the surface of the source diffusion layer. The contact 6a formed on the access transistor Qn11 is connected to the bit line BL1, and a contact 8a formed on the driver transistor Qn31 is connected to a ground potential line Vss1a. The contact 9a formed on the load transistor Qp11 is connected to the power supply potential line Vcc1.

Each of the gate electrodes of the driver transistor Qn31 and the load transistor Qp11 is connected to a common contact 11a formed on a gate line 18c extending from the respective gate electrodes. The contact 11a is connected to the contact 10b formed on the drain diffusion layer of the storage node 2b, through a storage node interconnection line Nb1. The contact 10a formed on the boundary between the drain diffusion layers 3a, 4a is connected to the contact 11b formed on the gate line 18d extending from the respective gate electrodes of the driver transistor Qn41 and the load transistor Qp21, through the storage node interconnection line Na1.

In the first embodiment, the N+ drain diffusion layers and the P+ drain diffusion layer each formed in the planar silicon layer (2a, 2b) serving as a storage node are directly connected to each other through the silicide layer formed in the surface of the planar silicon layer, so that the drain diffusion layers of the access transistor, the driver transistor and the load transistor serve as a storage node of the SRAM cell in a shared manner. Thus, element isolation is required only for isolating between the two storage nodes of the SRAM cell, without a need for element isolation for isolating between the N+ and P+ source/drain diffusion layers, which is generally necessary for a planar transistor. This makes it possible to achieve an extremely small SRAM cell area.

Preferably, in the first embodiment, the gate dielectric film is made of a High-k material, such as $HfO_2$, and the gate electrode is made of a metal, such as TiN or TaN, or formed in a laminated structure comprising a metal film and a partially-silicided polysilicon film.

Preferably, in the first embodiment, a channel region of the pillar-shaped silicon layer is doped with no impurity, or has an impurity concentration of $1\ e^{-17}\ cm^{-3}$ or less. The reason is that, if the impurity concentration is greater than this value, a variation in transistor characteristics due to statistical fluctuation of impurities becomes large to cause significant deterioration in SRAM operation margin, such as reading margin. In this case, a threshold adjustment of the transistor can be performed by adjusting a work function of a gate material, instead of the impurity concentration in the channel region.

With reference to FIGS. 4(a) to 19b, one example of a production method for forming a semiconductor device of the present invention will be described below. In FIGS. 4(a) to 19(b), the figure suffixed with (a) is a top plan view, and the figure suffixed with (b) is a sectional view taken along the line D-D'.

As shown in FIGS. 4(a) and 4(b), a mask 19 of a silicon nitride film having a film thickness of about 50 to 100 nm is formed on an SOI substrate in which a silicon layer having a film thickness of about 100 to 400 nm is formed on a buried oxide film layer (BOX) 1. Then, a pattern for a pillar-shaped silicon layer (21a to 23a, 21b to 23b) is formed by lithography, and the silicon layer is etched to form the pillar-shaped silicon layer (21a to 23a, 21b to 23b). The pillar-shaped silicon layer has a diameter of about 5 to 50 nm, and a height dimension of about 30 to 300 nm. In this step, a continuous planar silicon layer is formed underneath the pillar-shaped silicon layer to have a thickness of about 10 to 50 nm.

As shown in FIGS. 5(a) and 5(b), the continuous planar silicon layer is divided to form a planar silicon layer (2a, 2b) serving as a storage node. In this example, an element isolation region can be formed simply by dividing the continuous planar silicon layer. Thus, the element isolation region can be formed to have an isolation width equivalent to a minimum fabrication size, through a process having a less number of steps.

As shown in FIGS. 6(a) and 6(b), an impurity is introduced into each of two N+ implantation zones 24a, 24b and a P+ implantation zone 25, by ion implantation or the like, to form a drain diffusion layer in the planar silicon layer underneath the pillar-shaped silicon layer. Preferably, conditions for the implantation are adjusted to allow the impurity to be distributed to reach the buried oxide film 1 and cover a bottom of the pillar-shaped silicon layer. In this step, the silicon nitride film 19 prevents the impurity from being introduced into an upper portion of the pillar-shaped silicon layer.

As shown in FIGS. 7(a) and 7(b), a High-k film 17, such as an $HfO_2$ film, is formed as a gate dielectric film to have a thickness of about 1 to 5 nm, by a chemical vacuum deposition (CVD) process or an atomic layer deposition (ALD) process. Subsequently, a metal film 18, such as a TiN film or a TaN film, is formed as a gate conductive film to have a thickness of about 10 to 60 nm.

As shown in FIGS. 8(a) and 8(b), a silicon oxide film 31 is formed to fill a space between the pillar-shaped silicon layers.

As shown in FIGS. 9(a) and 9(b), the silicon oxide film 31, and respective portions of the gate conductive film 18 and the High-k film 17 above the pillar-shaped silicon layer, are polished by chemical mechanical polishing (CMP), to flatten a top surface of a gate. The flattening of the top surface of the gate by the CMP makes it possible to achieve an adequate gate configuration and suppress a variation in gate length. During the CMP, the silicon nitride film-based mask 19 on a top of the pillar-shaped silicon layer is used as a CMP stopper. The use of the silicon nitride film-based mask 19 as a CMP stopper makes it possible to control an amount of CMP with high repeatability.

As shown in FIGS. 10(a) and 10(b), the gate conductive film 18 and the silicon oxide film 31 are etched back to form a gate electrode on a sidewall of the pillar-shaped silicon layer so as to set a gate length. Conditions for the etching are adjusted to allow the gate conductive film 18 and the silicon oxide film 31 to be etched preferably at the same rate, and at a higher selectivity ratio relative to the silicon nitride film-based mask 19.

As shown in FIGS. 11(a) and 11(b), a silicon nitride film is formed and then etched back to form a silicon nitride film-based sidewall 32 on a top of the metal gate. In this step, an amount of the silicon nitride film to be formed and an amount of the silicon nitride film to be etched back are set to allow the silicon nitride film-based sidewall 32 remaining on the gate to accurately cover the gate. A portion of the gate covered by the silicon nitride film-based sidewall will be protected during etching in a subsequent step, so that the gate electrode is formed to have a film thickness of the gate conductive film, in a self-alignment manner.

As shown in FIGS. 12(a) and 12(b), the silicon oxide film 31 remaining on the metal gate is removed by wet etching.

As shown in FIGS. 13(a) and 13(b), a pattern for a gate line is formed by lithography using a resist or multilayer resist 33.

As shown in FIGS. 14(a) and 14(b), a bottom portion of the gate and the High-k film underneath the gate are removed by etching using the resist 33 as a mask. Consequently, a gate line (18a to 18d) is formed. As above, based on the structure where the silicon nitride film is formed on the top of the pillar-shaped silicon layer, the flattening of the top surface of the gate by CMP, the etching for setting the gate length, the formation of the silicon nitride film-based sidewall for protecting the gate electrode, the formation of the pattern for the gate line, and the etching for forming the gate line, are sequentially performed. This makes it possible to form the gate in an adequate configuration and with a small variation in size, and freely form the gate line. In addition, the gate electrode can be formed in a self-alignment manner, so that the film thickness of the gate electrode can be set to a minimum value to reduce an occupancy area.

As shown in FIGS. 15(a) and 15(b), the silicon nitride film-based mask 19 and the silicon nitride film-based sidewall 32 are removed by wet etching.

As shown in FIGS. 16(a) and 16(b), a silicon nitride film having a film thickness of 10 to 50 nm is formed and then etched back to form a structure where a sidewall of an upper portion of the pillar-shaped silicon layer and a sidewall of the gate are covered by the silicon nitride film 34. This structure allows the high-k film 17 to be covered by the silicon nitride film 34, so as to prevent the high-k film 17 from being damaged by wet treatment and impurity implantation in subsequent steps.

In this step, it is necessary to select an optimal film thickness of the silicon nitride film, because an excessively small film thickness of the silicon nitride film makes it impossible to fully prevent the damage of the high-k film 17, and an excessively large film thickness of the silicon nitride film causes an increase in occupancy area by just the film thickness thereof formed on the sidewall of the gate.

As shown in FIGS. 17(a) and 17(b), an impurity is introduced into each of the N$^+$ implantation zones and the P$^+$ implantation zone, by ion implantation or the like, to form a source diffusion layer (14, 16) in an upper portion of the pillar-shaped silicon layer.

As shown in FIGS. 18(a) and 18(b), each of the drain and source diffusion layers is selectively silicided through sputtering of a metal, such as Co or Ni, and a heat treatment, to form a silicide layer (13a, 13b) on the drain diffusion layers, and a silicide layer 15 on the source diffusion layers in the upper portions of the pillar-shaped silicon layers.

In this structure, the silicon nitride film 34 covering the sidewall of the pillar-shaped silicon layer and the gate electrode can suppress short-circuiting between the drain and the gate and between the source and the gate due the silicide layers.

As shown in FIGS. 19(a) and 19(b), after forming a silicon oxide film serving as an interlayer film, a contact (6a to 10a, 6b to 10b) is formed.

Preferably, in the first embodiment, an impurity distribution is set to allow the drain diffusion layer (3a to 5a, 3b to 5b) underneath the pillar-shaped silicon layer to be formed to reach the buried oxide film layer (BOX) 1, and an impurity concentration and a size of the pillar-shaped silicon layer are set to allow an inside of the pillar-shaped silicon layer to become fully depleted during a transistor operation. As a result of setting the impurity distribution in the drain diffusion layer (3a to 5a, 3b to 5b) in the above manner, the inside of the pillar-shaped silicon layer is kept in a floating body structure irrespective of a transistor operation state. In addition, as a result of setting the impurity concentration and the size of the pillar-shaped silicon layer in the above manner, the inside of the pillar-shaped silicon layer is fully depleted during a transistor operation, so that an electric field inside the pillar-shaped silicon layer can be relaxed to improve carrier mobility. Furthermore, as a result of diffusing the impurity for the drain diffusion layer (3a to 5a, 3b to 5b) to reach the buried oxide film 1, a capacitance component in a bottom of the drain diffusion layer is significantly reduced, so that a total parasitic capacitance of the drain diffusion layer can be reduced. In the sectional views of FIGS. 3a to 3d, the impurity is diffused to fully cover the bottom of the pillar-shaped silicon layer. However, even if the impurity does not fully cover the bottom of the pillar-shaped silicon layer, there is no problem in transistor operation.

One example of a technique of defining each dimension in the structure of the SRAM according to the first embodiment will be described below.

Firstly, it is desirable to keep the silicide layer (13a, 13b) in the surface of the drain diffusion layer from reaching the bottom of the planar silicon layer (2a, 2b). A resistance in an interface between the drain diffusion layer (3a to 5a, 3b to 5b) and the silicide layer (13a, 13b) is one major factor of a source/drain parasitic resistance of an SGT. Thus, it is preferable to maximize an area of the interface between the drain diffusion layer and the silicide layer. If the silicide layer (13a, 13b) is formed to reach the bottom of the planar silicon layer (2a, 2b), a bottom surface of the silicide layer (13a, 13b) will no longer be an interface with the drain diffusion layer (3a to 5a, 3b to 5b), and only side surfaces of the silicide layer (13a, 13b) will remain as the interface with the drain diffusion layer. Therefore, an area of the interface between the drain diffusion layer (3a to 5a, 3b to 5b) and the silicide layer (13a, 13b) is significantly reduced. In the first embodiment, the film thickness of the silicide layer (13a, 13b) is in the range of about 10 to 30 nm. For the above reason, it is necessary to set a film thickness of the planar silicon layer (2a, 2b) to be greater than that of the silicide layer (13a, 13b). However, if the planar silicon layer (2a, 2b) has an excessively large film thickness, a step of an edge of the planar silicon layer (2a, 2b) with respect to the buried oxide film layer (BOX) becomes larger during etching for the gate line to cause difficulty in forming the gate line in a desired shape and size by etching. In order to stably form the gate line in a desired shape and size by etching, it is necessary to set the film thickness of the planar silicon layer (2a, 2b) to be less than 100 nm. In the first embodiment, it is preferable to minimize a thickness of the gate electrode around the pillar-shaped silicon layer, in view of allowing intervals of SGTs to be minimized. Further, as a prerequisite to preventing a sheet resistance of the gate line from posing a problem for an SRAM circuit, the gate line is required to have a film thickness of about 10 nm at the minimum. Thus, the film thickness of the gate line is set in the range of about 10 to 50 nm. In the first embodiment, when the film thickness of each of the silicide layer, the planar silicon layer and the gate meets the above requirement, an optimal structure can be achieved.

Second Embodiment

Figure 20:
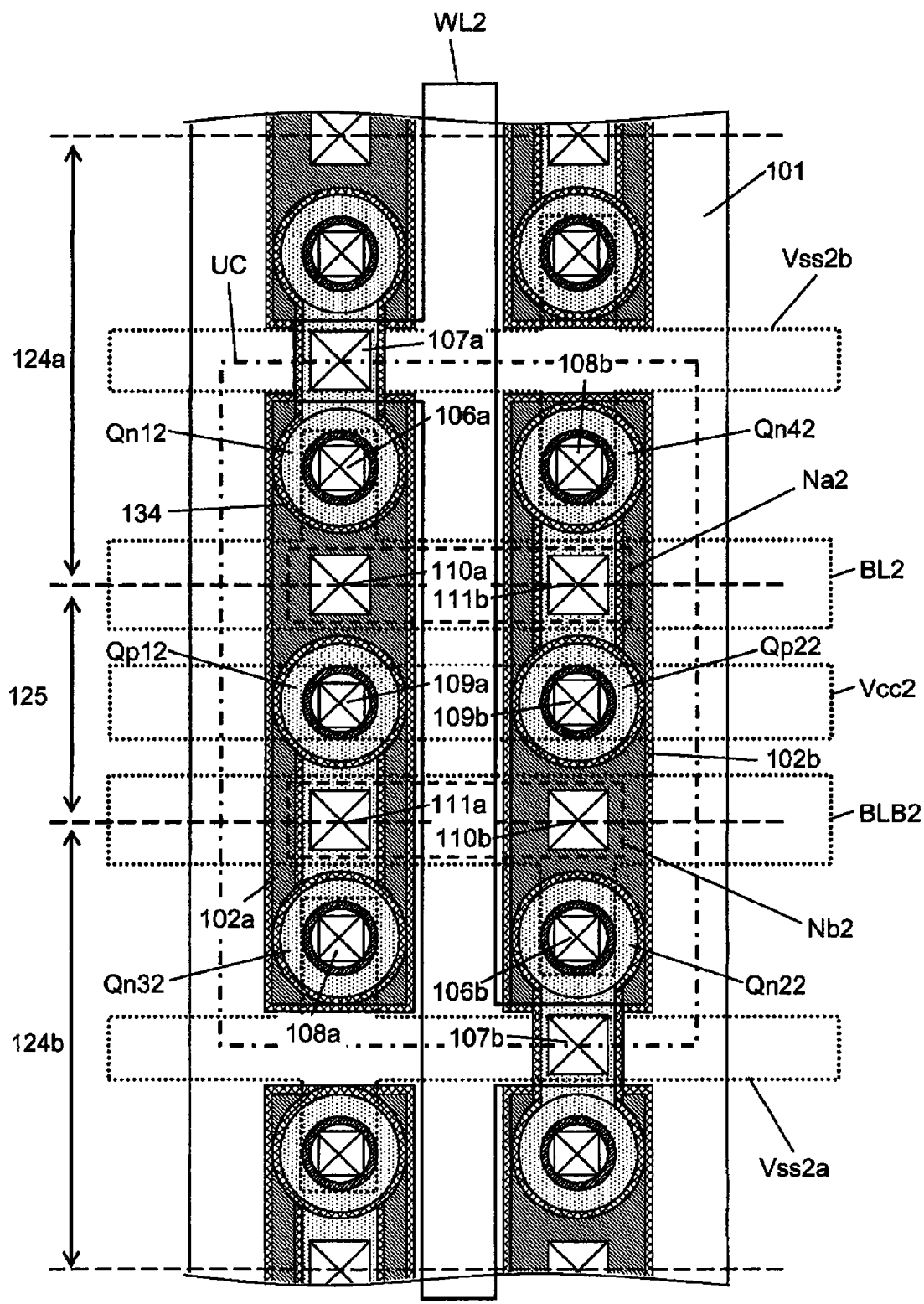
FIG. 20 is a top plan view showing a memory cell of an SRAM according to a second embodiment of the present invention.

FIG. 20 illustrates a layout of a memory cell in an SRAM according to a second embodiment of the present invention.

In the second embodiment, an arrangement of three transistors arrayed in a 1st column of a unit cell UC illustrated in FIG. 20 in an SRAM cell array is identical to that of three transistors arrayed in a 2nd column in a memory cell adjacent to and on an upper or lower side of the unit cell UC, and an arrangement of three transistors arrayed in a 2nd column of the unit cell UC is identical to that of three transistors arrayed in a 1st column in the memory cell adjacent to and on the upper or lower side of the unit cell UC. Specifically, three transistors are arrayed on the upper side of transistors Qn12, Qp12, Qn32 arrayed in the 1st column of the unit cell UC in FIG. 20, in the same arrangement as that of transistors Qn42, Qp22, Qn22 arrayed in the 2nd column of the unit cell UC in FIG. 20, in this order in a downward direction. Thus, in FIG. 20, an access transistor is disposed adjacent to and on the upper side of the access transistor Qn12, and an access transistor is disposed adjacent to and on the lower side of the access transistor Qn22. In this arrangement of the SRAM cells, a gate line extending from a gate electrode of the access transistor (Qn12, Qn22) can be connected to a gate electrode of the access transistor disposed adjacent to and on the upper or lower side of the access transistor (Qn12, Qn22), and a common contact (107a, 107b) connected to a word line WL2 can be formed on the gate line. In the first embodiment, the contact (107a, 107b) connected to the word line WL2 is formed between the first and second storage nodes. In the second embodiment, the contact (107a, 107b) is disposed on a boundary between the upper and lower SRAM cells, so that a space between the storage nodes can be reduced to reduce a lateral (in FIG. 20) length of the SRAM cell.

The above technique of sharing the contact for the respective gate electrodes of the two access transistors can also be applied to the transistor arrangement in the first embodiment. For example, in FIG. 2, a gate line is formed to extend obliquely rightwardly and upwardly from the gate electrode of the access transistor Qn11, and connected to a gate line extending obliquely leftwardly and downwardly from a gate electrode of an access transistor disposed on an obliquely rightward and upward side of the access transistor Qn11, and a common contact is formed on the connected gate line. In this manner, a contact connected to a word line can be shared as long as two access transistors in adjacent memory cells are arranged to allow gate electrodes thereof to be located adjacent to each other.

As mentioned in the first embodiment, in order to share each of the word line, the bit lines, the power supply potential line and the ground potential line, with other memory cells, such a line is preferably laid out in a higher-level layer than the node interconnection lines to be wired in each of the memory cells. As one example of the hierarchical wiring configuration, it is contemplated that a node interconnection line (Na1, Nb1) is wired in a lower-level layer, wherein the word line WL2 is wired in a mid-level layer, and each of a bit line (BL2, BLB2), a power supply potential line Vcc2 and a ground potential line (Vss2a, Vss2b) is wired in a higher-level layer, to keep each line from coming in contact with an unintended one of the contacts.

The remaining structure is the same as that in the first embodiment, and its description will be omitted.

Third Embodiment

Figure 21:
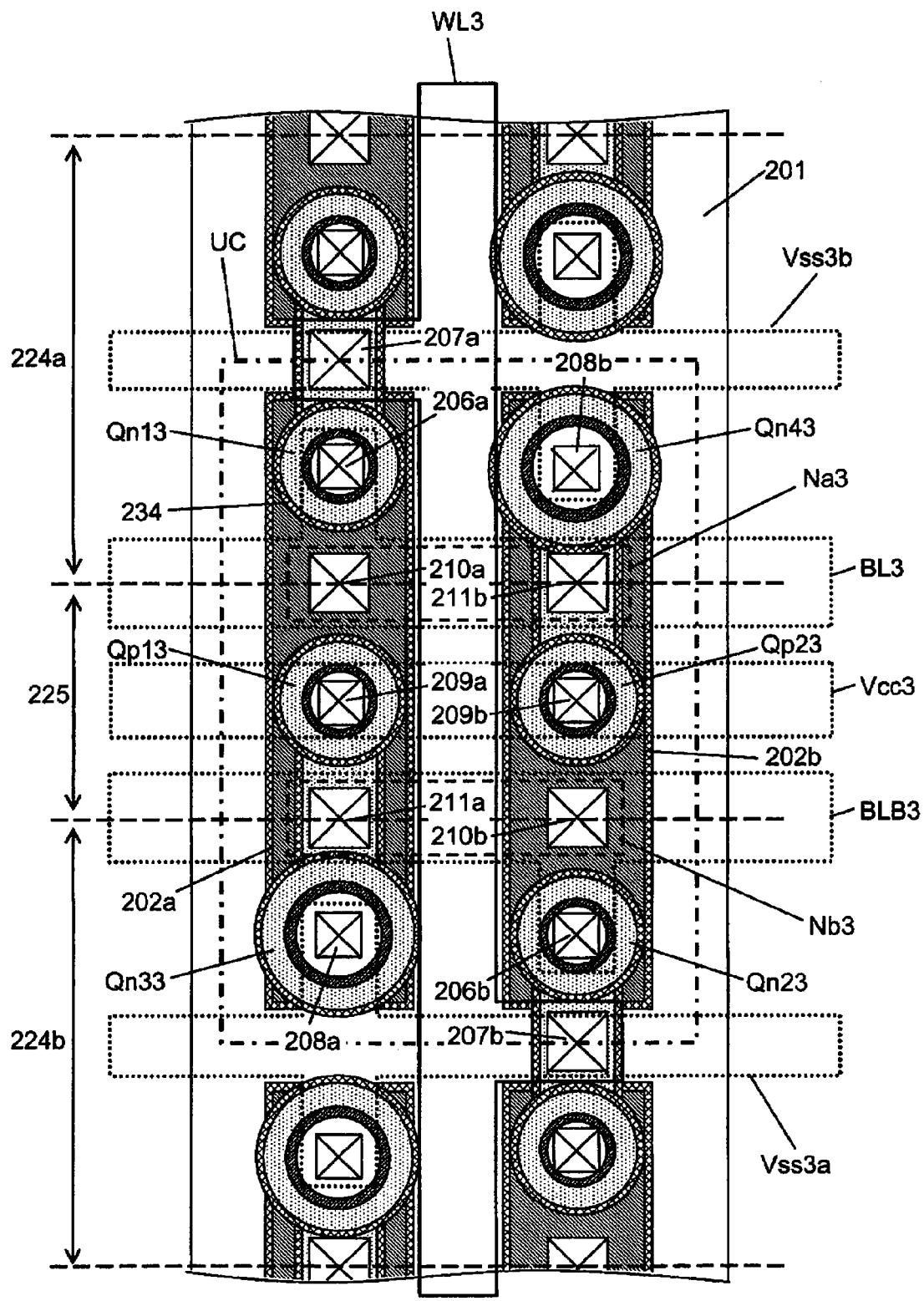
FIG. 21 is a top plan view showing a memory cell of an SRAM according to a third embodiment of the present invention.

FIG. 21 illustrates a layout of a memory cell in an SRAM according to a third embodiment of the present invention. The third embodiment is different from the second embodiment in a shape of a pillar-shaped silicon layer constituting a driver transistor. In a 6T SRAM, a drain current of a driver transistor is typically set to be greater than that of an access transistor to ensure an operation margin during reading. In a planar transistor, a drain current can be increased by setting a width of a diffusion layer of a driver transistor to be greater than that of a diffusion layer of an access transistor. In an SGT, a drain current can be increased by increasing a diameter of a pillar-shaped silicon layer to increase a peripheral length of the pillar-shaped silicon layer. As shown in FIG. 21, the reading margin can be improved by setting a diameter of a pillar-shaped silicon layer constituting a driver transistor to be greater than that of a pillar-shaped silicon layer constituting other transistor. However, it is necessary to increase a size of a pillar-shaped silicon layer, while taking into account a risk that it is likely to cause the occurrence of short-channel effects. A cross-sectional shape of the pillar-shaped silicon layer is not limited to a circular shape, but the peripheral length of the pillar-shaped silicon layer may be increased by forming the pillar-shaped silicon layer in an oval shape or a rectangular shape.

Further, various SRAM characteristics can be adjusted by changing a shape of each of an access transistor, a driver transistor and a load transistor. For example, with a view to increasing an operation speed, a diameter of the access transistor may be increased to increase a drain current value of the access transistor. With a view to improving the writing margin, a diameter of the load transistor is reduced to relatively reduce a drain current of the load transistor as compared with those of other transistors.

As mentioned in the first embodiment, in order to share each of the word line, the bit lines, the power supply potential line and the ground potential line, with other memory cells, such a line is preferably laid out in a higher-level layer than the node interconnection lines to be wired in each of the memory cells. As one example of the hierarchical wiring configuration, the same configuration as that in the second embodiment may be employed.

The remaining structure is the same as that in the second embodiment, and its description will be omitted.

Fourth Embodiment

Figure 22:
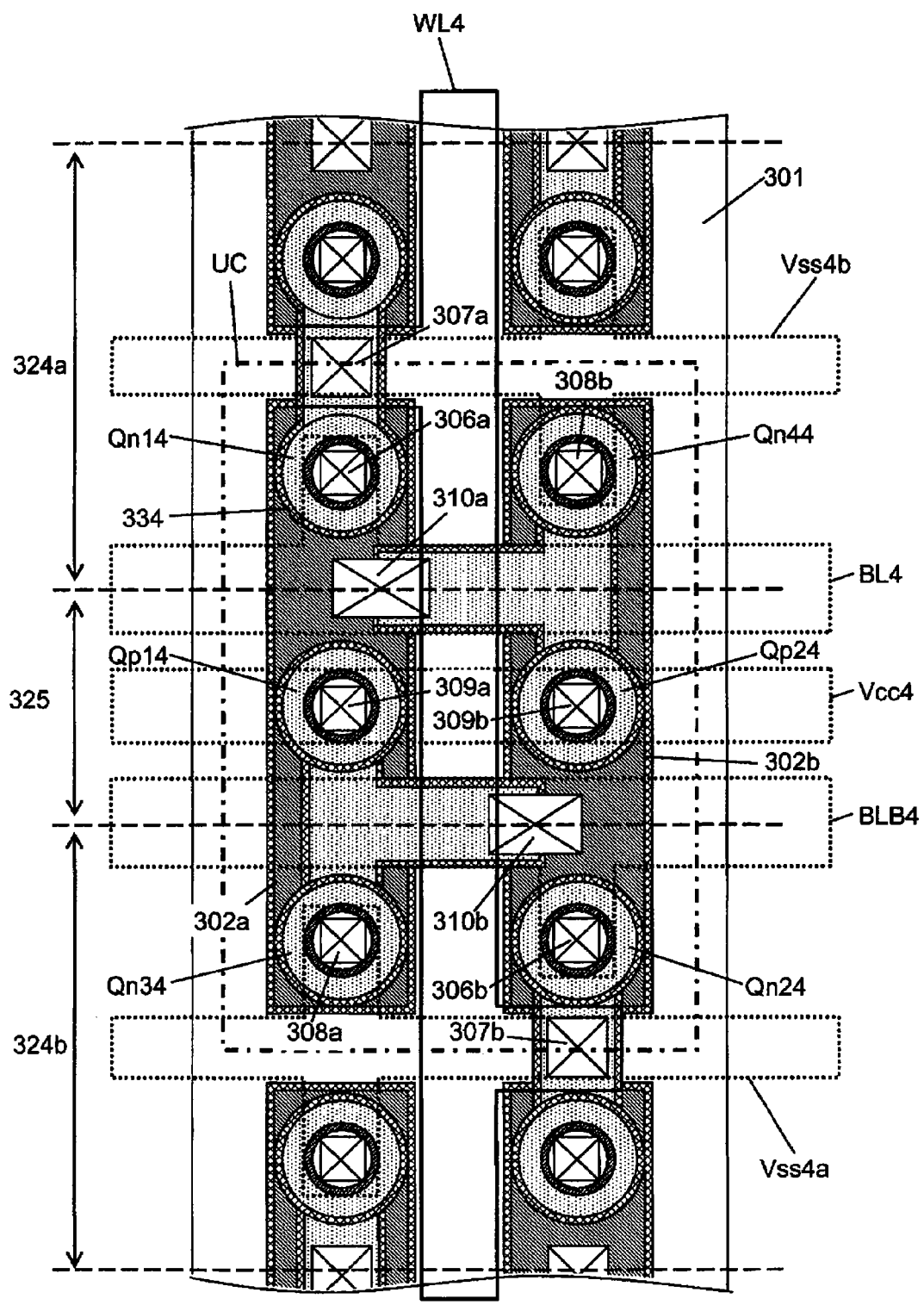
FIG. 22 is a top plan view showing a memory cell of an SRAM according to a fourth embodiment of the present invention.

FIG. 22 illustrates a layout of a memory cell in an SRAM according to a fourth embodiment of the present invention. The fourth embodiment is different from the second embodiment in that a storage node and a gate line are connected to each other through a common contact formed to extend thereacross. Referring to FIG. 22, a planar silicon layer 302a serving as a storage node, and a gate line extending from respective gate electrodes of a driver transistor Qn44 and a load transistor Qp24, are connected to each other through a common contact 310a formed to extend thereacross. Further, a planar silicon layer 302b serving as a storage node, and a gate line extending from respective gate electrodes of a driver transistor Qn34 and a load transistor Qp14, are connected to each other through a common contact 310b formed to extend thereacross. As above, the gate and the storage node are connected to each other through the contact, instead of an interconnection layer, so that the number of contacts can be reduced. Thus, a cell area can be reduced by adjusting an arrangement of pillar-shaped silicon layers and contacts.

As mentioned in the first embodiment, in order to share each of the word line, the bit lines, the power supply potential line and the ground potential line, with other memory cells, such a line is preferably laid out in a higher-level layer than the node interconnection lines to be wired in each of the memory cells, i.e., through a higher-level layer than the contact 310a and the contact 310b.

The remaining structure is the same as that in the second embodiment, and its description will be omitted.

Fifth Embodiment

Figure 23:
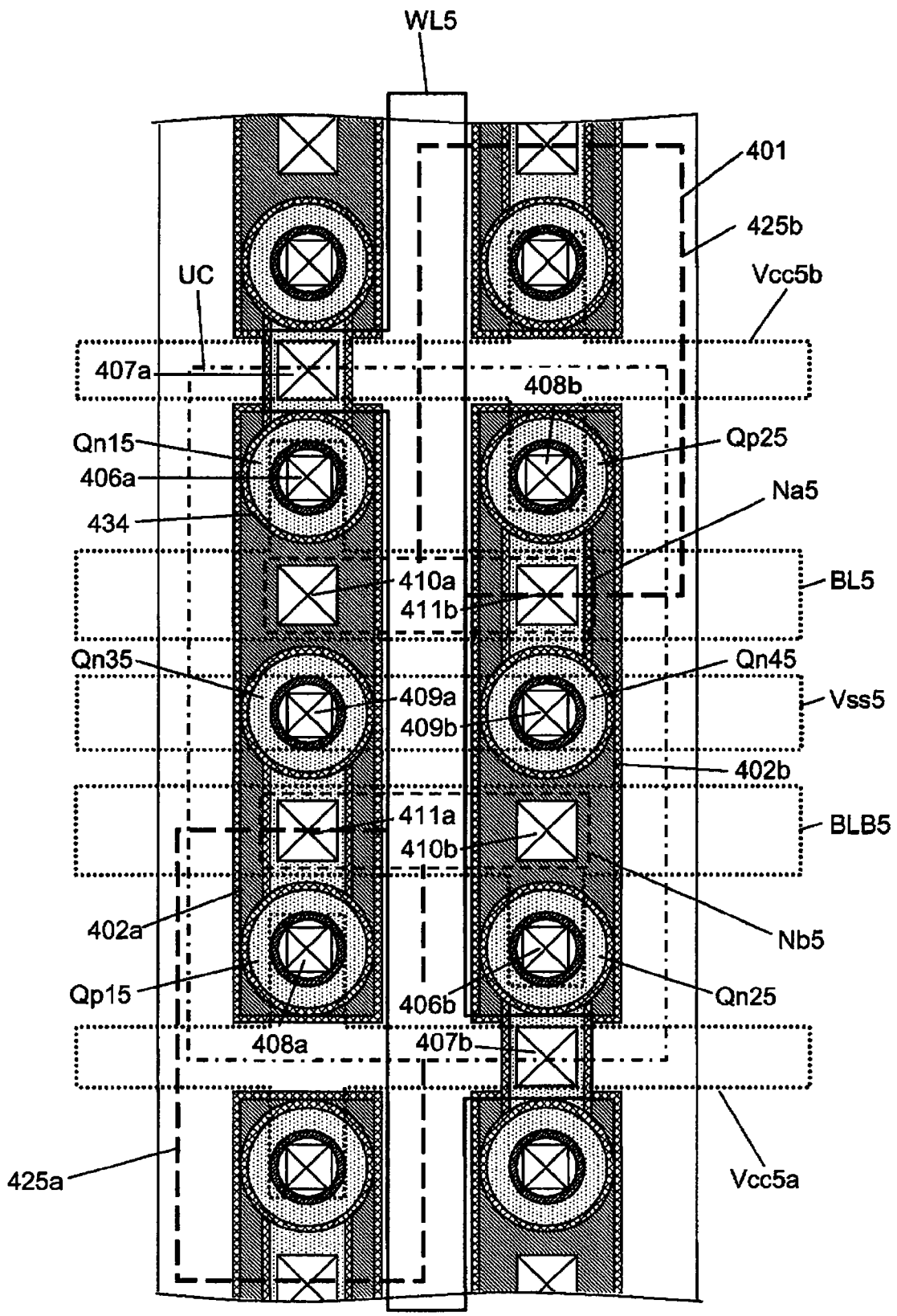
FIG. 23 is a top plan view showing a memory cell of an SRAM according to a fifth embodiment of the present invention.

FIG. 23 illustrates a layout of a memory cell in an SRAM according to a fifth embodiment of the present invention. The fifth embodiment is different from the second embodiment in that the driver transistor and the load transistor are positionally interchanged. In the fifth embodiment, due to the positional interchange between driver transistor and the load transistor, there is only one boundary extending between an $N^+$ implantation zone and a $P^+$ implantation zone (425a, 425b) to cross a planar silicon layer (402a, 402b). Thus, there is only one position where it is necessary to ensure an overlapping margin around the boundary between the $N^+$ implantation zone and the $P^+$ implantation zone, so that a longitudinal length of the SRAM cell can be reduced. However, instead of defining the $N^+$ implantation zone and the $P^+$ implantation zone by simple lines and spaces as in the first embodiment, the $P^+$ implantation zone (425a, 425b) has a rectangular-shaped groove pattern, and the $N^+$ implantation zone has a pattern formed by inverting the $P^+$ implantation zone (425a, 425b). Thus, in patterning of the implantation zones, it is necessary to accurately control a resist pattern.

In the fifth embodiment, differently from the second embodiment, in connection with the positional interchange between driver transistor and the load transistor, a power supply potential line (Vcc5a, Vcc5b) and a ground line Vss5 are positionally interchanged.

As mentioned in the first embodiment, in order to share each of the word line, the bit lines, the power supply potential line and the ground potential line, with other memory cells, such a line is preferably laid out in a higher-level layer than the node interconnection lines to be wired in each of the memory cells. As one example of the hierarchical wiring configuration, the same configuration as that in the second embodiment may be employed.

The remaining structure is the same as that in the second embodiment, and its description will be omitted.

Sixth Embodiment

Figure 24:
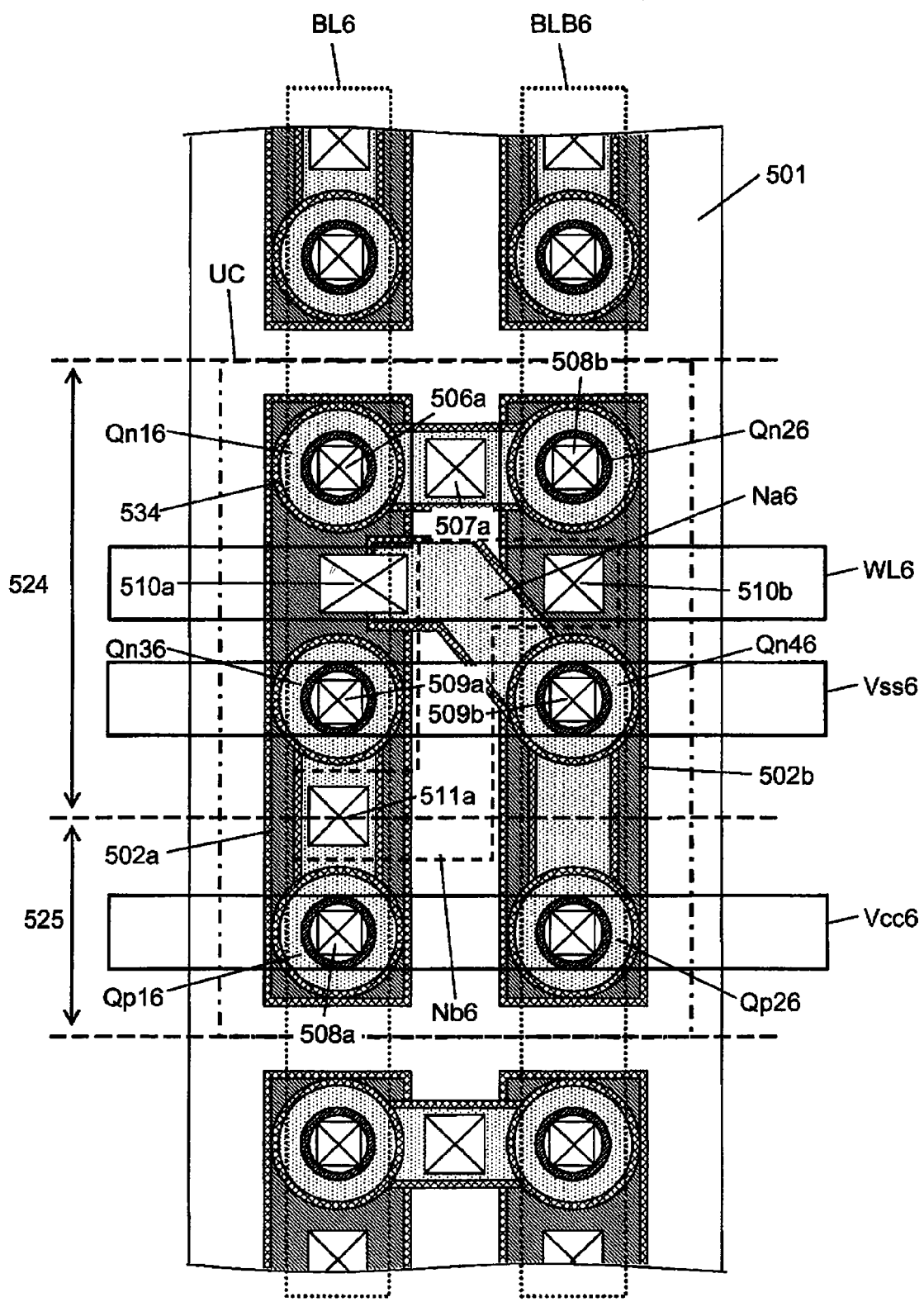
FIG. 24 is a top plan view showing a memory cell of an SRAM according to a sixth embodiment of the present invention.

FIG. 24 illustrates a layout of a memory cell in an SRAM according to a sixth embodiment of the present invention. The sixth embodiment is different from the second embodiment in an arrangement of transistors constituting the SRAM cell. In the sixth embodiment, due to the change in transistor arrangement, there is only one boundary line extending between an $N^+$ implantation zone 524 and a $P^+$ implantation zone 525 to cross a planar silicon layer (502a, 502b). Thus, there is only one position where it is necessary to ensure an overlapping margin around the boundary between the $N^+$ implantation zone and the $P^+$ implantation zone, so that a longitudinal length of the SRAM cell can be reduced. In addition, the $N^+$ implantation zone 524 and the $P^+$ implantation zone 525 are formed by simple lines and spaces, as with the first embodiment. Thus, a dimensional margin around the boundary between the $N^+$ implantation zone and the $P^+$ implantation zone can be kept to the minimum, so that a longitudinal length of the SRAM cell can be further reduced, as compared with the fifth embodiment. Further, access transistors Qn16, Qn26 are arranged adjacent to each other, so that a common contact can be formed on a gate line extending from respective gate electrodes thereof.

As shown in FIG. 24, a planar silicon layer 502a serving as a storage node, and a gate line extending from respective gate electrodes of a driver transistor Qn46 and a load transistor Qp26, are connected through a contact 510a, and a contact 510b formed on a planar silicon layer 502b serving as a storage node is connected to a contact 511a through a node interconnection line Nb6 which is a first-layer line. As above, in the sixth embodiment, the wiring in the SRAM cell is bilaterally asymmetric, and thereby SRAM characteristics are likely to become bilaterally asymmetric. If the SRAM characteristics become bilaterally asymmetric, the SRAM operation margin will deteriorate. Thus, in the sixth embodiment, it is necessary to take account of asymmetry of the SRAM characteristics.

Differently from the first to fifth embodiments, in the sixth embodiment, a word line WL6 is wired in a lateral direction, and a bit line (BL6, BLB6) is wired in a longitudinal direction. Further, two driver transistors Qn36, Qn46 are formed on the same row, and two load transistors Qp16, Qp26 are formed on the same row. Thus, the driver transistors Qn36, Qn46 can be connected to a power supply potential line Vcc6, and the load transistors Qp16, Qp26 can be connected to a ground line Vss6, in a simple layout.

As mentioned in the first embodiment, in order to share each of the word line, the bit lines, the power supply potential line and the ground potential line, with other memory cells, such a line is preferably laid out in a higher-level layer than the node interconnection lines to be wired in each of the memory cells. As one example of the hierarchical wiring configuration, it is contemplated that a node interconnection line (Na6, Nb6) is wired in a lower-level layer, wherein each of the word line WL6, the power supply potential line Vcc6 and the ground potential line Vss6 is wired in a mid-level layer, and the bit line (BL6, BLB6) is wired in a higher-level layer.

Seventh Embodiment

Figure 25:
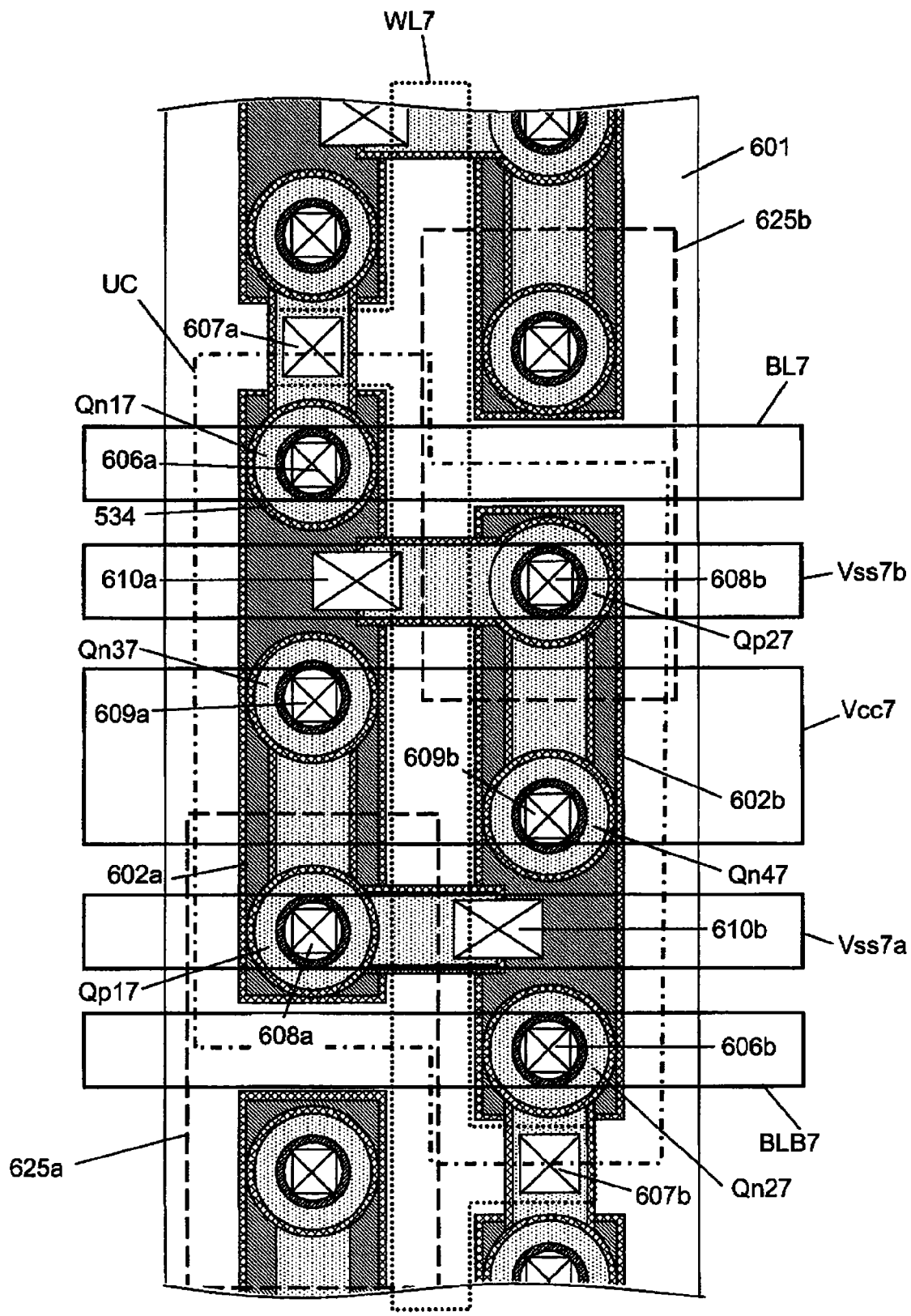
FIG. 25 is a top plan view showing a memory cell of an SRAM according to a seventh embodiment of the present invention.

FIG. 25 illustrates a layout of a memory cell in an SRAM according to a seventh embodiment of the present invention. The seventh embodiment is different from other embodiments in that six pillar-shaped silicon layers are arrayed in a hexagonal lattice pattern to have a close-packed arrangement. In the seventh embodiment, the pillar-shaped silicon layers can be arranged in the smallest area in a balanced manner, so that the SRAM can be designed to have a sufficiently-small cell area. The arrangement of transistors is not limited to the hexagonal lattice pattern illustrated in FIG. 25, but any other suitable close-packed arrangement may be employed.

As mentioned in the first embodiment, in order to share each of the word line, the bit lines, the power supply potential line and the ground potential line, with other memory cells, such a line is preferably laid out in a higher-level layer than the node interconnection lines to be wired in each of the memory cells. As one example of the hierarchical wiring configuration, the same configuration as that in the second embodiment may be employed.

Eighth Embodiment

Figure 26:
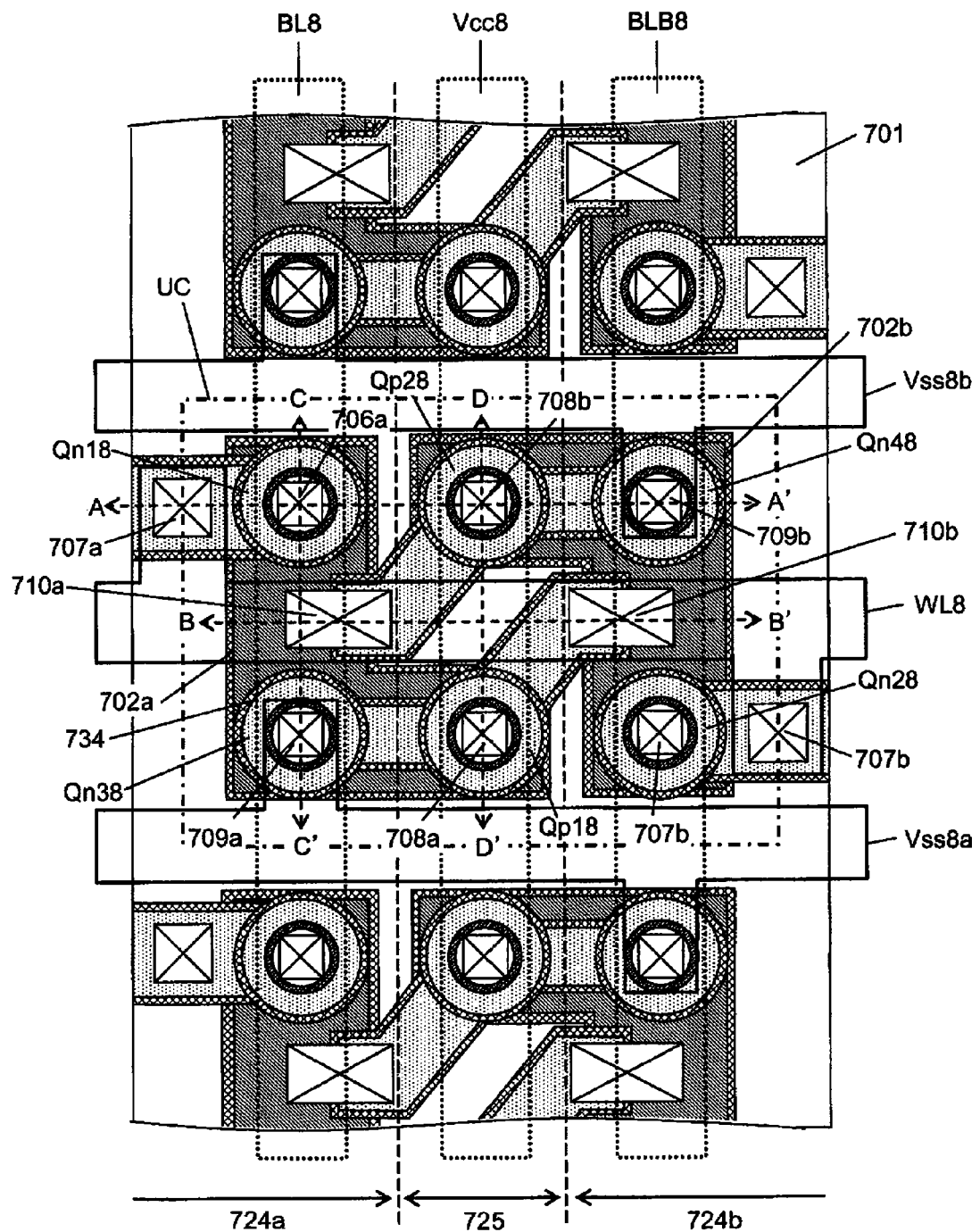
FIG. 26 is a top plan view showing a memory cell of an SRAM according to an eighth embodiment of the present invention.

FIG. 26 illustrates a layout of the memory cell in the SRAM according to an eighth embodiment of the present invention. In an SRAM cell array, a unit cell illustrated in FIG. 26 is iteratively arranged. FIGS. 27a, 27b, 27c and 27d are sectional views taken along the lines A-A', B-B', C-C' and D-D' in FIG. 26, respectively.

With reference to FIGS. 26 and 27a to 27d, the layout of the memory cell in the SRAM according to the eighth embodiment will be described below.

The eighth embodiment is different from the first to seventh embodiments in that a planar silicon layer is formed in an L shape. As for easiness of patterning, the rectangular-shaped planar silicon layer in the first to seventh embodiments is superior to an L-shaped planar silicon layer (702a, 702b) serving as a storage node. However, as with the fifth and sixth embodiments, in the eighth embodiment, there is only one boundary line extending between an N$^+$ implantation zone (724a, 724b) and a P$^+$ implantation zone 725 to cross the planar silicon layer (702a, 702b), and a pattern for defining the N$^+$ implantation zone (724a, 724b) and the P$^+$ implantation zone 725 is formed by simple lines and spaces. Thus, a dimensional margin around the boundary between the N$^+$ implantation zone (724a, 724b) and the P$^+$ implantation zone 725 can be kept to the minimum, so that the SRAM cell can be designed to have a sufficiently-small cell area.

In the eighth embodiment, a word line WL8 is wired in a lateral direction, and a bit line (BL8, BLB8) is wired in a longitudinal direction. Although not illustrated, a contact (707a, 707b) connected to a bit line and to a gate of an access transistor can be shared with a memory cell adjacent to and on a lateral side of the unit cell. The planar silicon layer 702a serving as a storage node, and a gate line extending from respective gate electrodes of a driver transistor Qn48 and a load transistor Qp28, are connected to each other through a common contact 710a formed to extend thereacross. Further, the planar silicon layer 702b serving as a storage node, and a gate line extending from respective gate electrodes of a driver transistor Qn38 and a load transistor Qp18, are connected to each other through a common contact 710b formed to extend thereacross.

As mentioned in the first embodiment, in order to share each of the word line, the bit lines, the power supply potential line and the ground potential line, with other memory cells, such a line is preferably laid out in a higher-level layer than the node interconnection lines to be wired in each of the memory cells, i.e., through a higher-level layer than the contact 707a and the contact 707b. As one example of the hierarchical wiring configuration, it is contemplated that a node interconnection line is wired in a lower-level layer, wherein each of the word line WL8 and a ground potential line (Vss8a, Vss8b) is wired in a mid-level layer, and each of the bit line (BL8, BLB8) and a power supply potential line Vcc8 is wired in a higher-level layer.

Figure 27A:
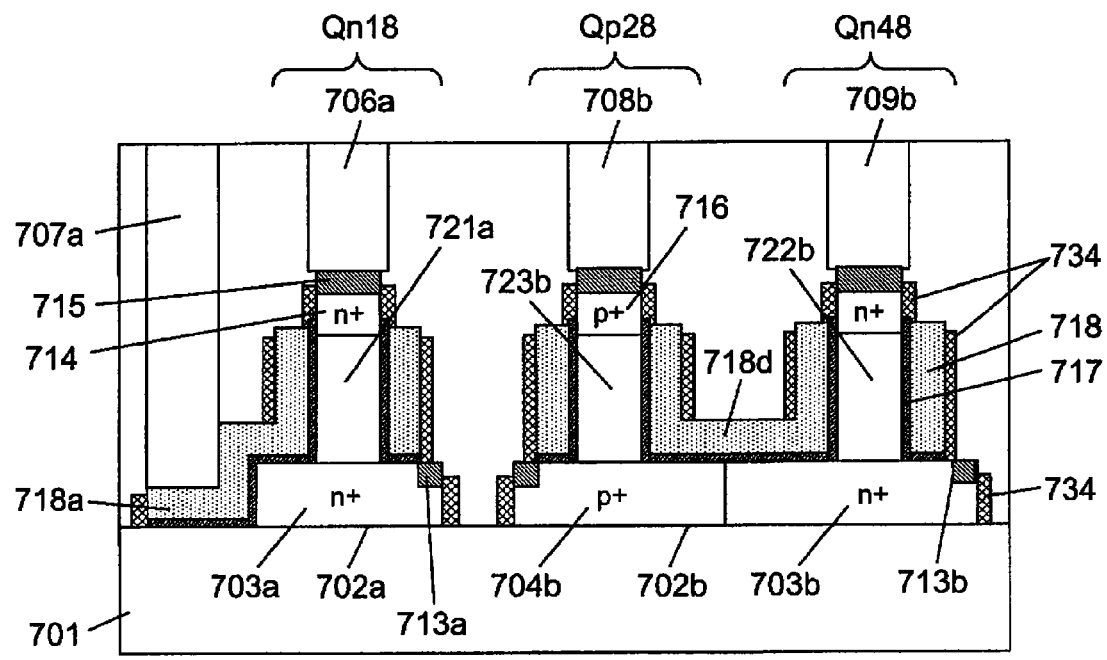
FIG. 27a is a sectional view showing the memory cell of the SRAM according to the eighth embodiment.

With reference to the section views of FIGS. 27a to 27d, a structure of the SRAM according to the eighth embodiment will be described below. As shown in FIG. 27a, a planar silicon layer (702a, 702b) serving as a storage node is formed on a buried oxide film layer 701, and an N$^+$ drain diffusion layer (703a, 703b) and a P$^+$ drain diffusion layer 704b are formed in the planar silicon layer (702a, 702b) by impurity implantation or the like.

A silicide layer (713a, 713b) is formed in a surface of the drain diffusion layer (703a, 703b, 704b). Although not illustrated, the N$^+$ drain diffusion layer 703b and the P$^+$ drain diffusion layer 704b are connected to each other through the silicide layer 713b. A pillar-shaped silicon layer 721a constituting an access transistor Qn18 is formed on the N$^+$ drain diffusion layer 703a, and a pillar-shaped silicon layer 723b constituting a load transistor Qp28 is formed on the P$^+$ drain diffusion layer 704b. Further, a pillar-shaped silicon layer 722b constituting a driver transistor Qn48 is formed on the N$^+$ drain diffusion layer 703b. A gate dielectric film 717 and a gate electrode 718 are formed around each of the pillar-shaped silicon layers. A source diffusion layer (714, 716) is formed in an upper portion of the pillar-shaped silicon layer by impurity implantation or the like, and a silicide layer 715 is formed in a surface of the source diffusion layer. A contact 706a formed on the access transistor Qn18 is connected to a bit line BL8, and a contact 707a formed on a gate line 718a extending from the gate electrode of the access transistor Qn18 is connected to a word line WL8. A contact 708b formed on the load transistor Qp28 is connected to a power supply potential line Vcc8, and a contact 709b formed on the driver transistor Qn48 is connected to a ground potential line Vss8b. The gate electrodes of the load transistor Qp28 and the driver transistor Qn48 are connected to each other through a gate line 718d extending from the respective gate electrodes.

Figure 27B:
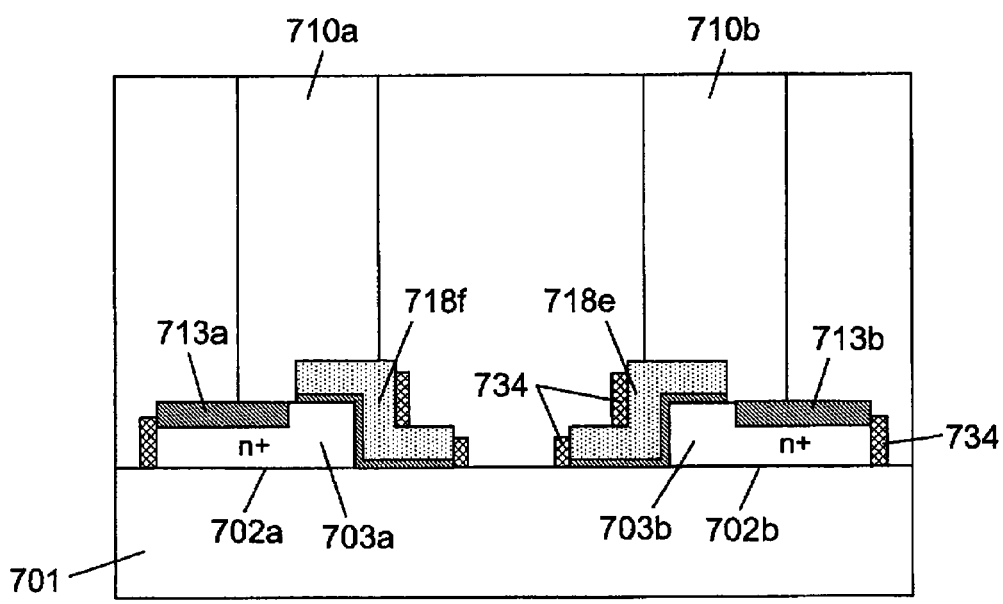
FIG. 27b is a sectional view showing the memory cell of the SRAM according to the eighth embodiment.

As shown in FIG. 27b, the planar silicon layer (702a, 702b) serving as a storage node is formed on the buried oxide film layer 701, and the N$^+$ drain diffusion layer (703a, 703b) is formed in the planar silicon layer (702a, 702b) by impurity implantation or the like. The silicide layer (713a, 713b) is formed in the surface of the N$^+$ drain diffusion layer. The drain diffusion layer 703a and a gate line 718f are connected to each other through a common contact 710a formed to extend thereacross, and the drain diffusion layer 703b and a gate line 718e are connected to each other through a common contact 710b formed to extend thereacross.

Figure 27C:
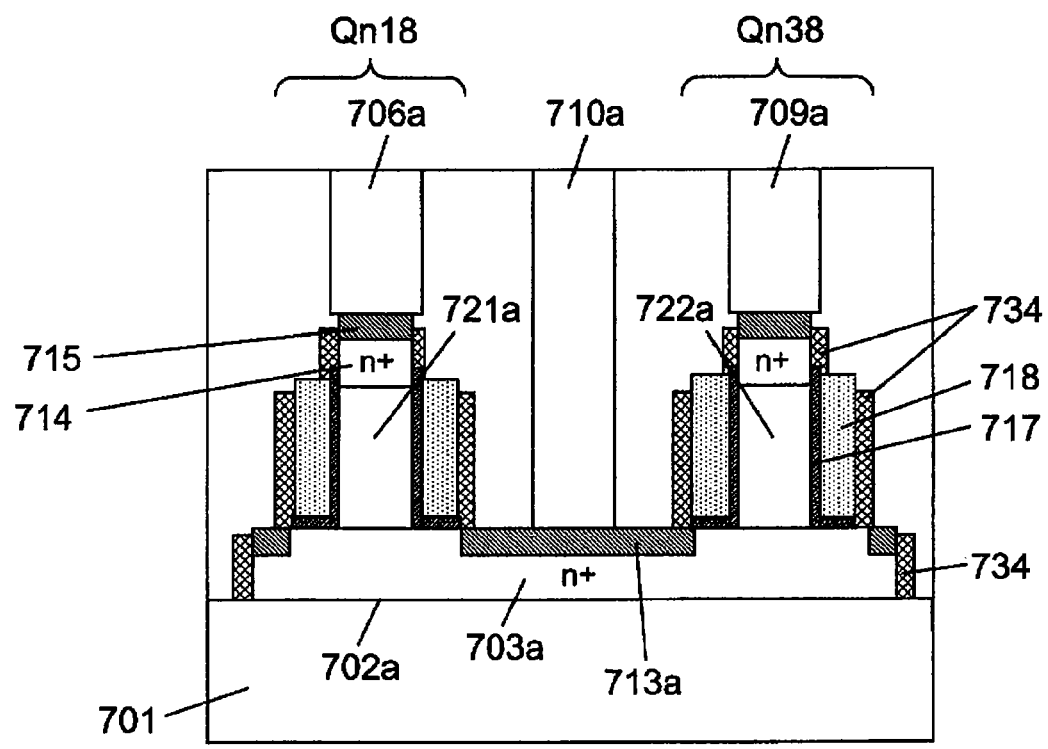
FIG. 27c is a sectional view showing the memory cell of the SRAM according to the eighth embodiment.

As shown in FIG. 27c, the planar silicon layer 702a serving as a storage node is formed on the buried oxide film layer 701, and the N$^+$ drain diffusion layer 703a is formed in the planar silicon layer 702a by impurity implantation or the like. The silicide layer 713a is formed in the surface of the N$^+$ drain diffusion layer 703a. The pillar-shaped silicon layer 721a constituting the access transistor Qn18, and a pillar-shaped silicon layer 722a constituting a driver access transistor Qn38, are formed on the N$^+$ drain diffusion layer 703a. The gate dielectric film 717 and the gate electrode 718 are formed around each of the pillar-shaped silicon layers. The N$^+$ source diffusion layer 714 is formed in an upper portion of the pillar-shaped silicon layer by impurity implantation or the like, and the silicide layer 715 is formed in a surface of the source diffusion layer. The contact 706a formed on the access transistor Qn18 is connected to the bit line BL8, and a contact 709a formed on the driver transistor Qn38 is connected to a ground potential line Vss8a through an interconnection layer.

Figure 27D:
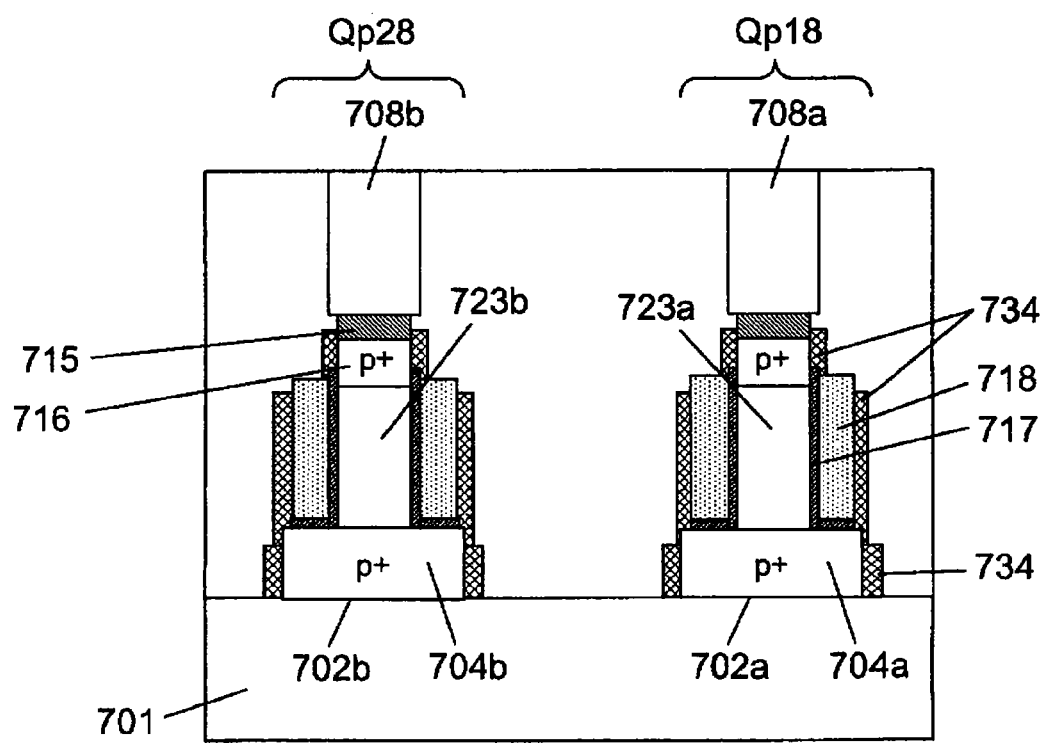
FIG. 27d is a sectional view showing the memory cell of the SRAM according to the eighth embodiment.
Figure 28:
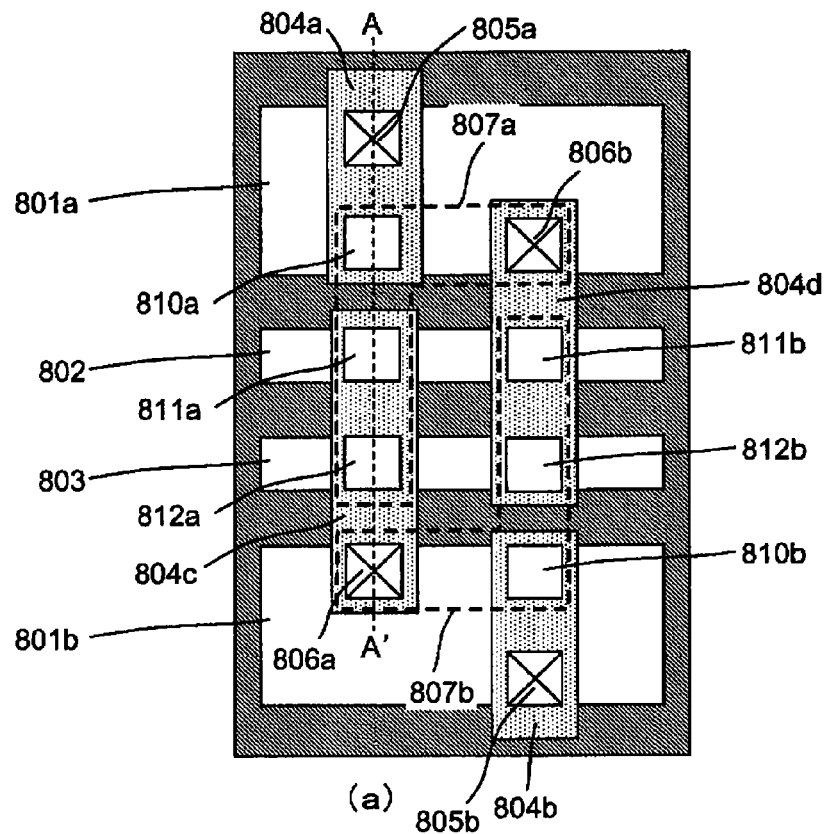
FIGS. 28(a) and 28(b) are, respectively, a top plan view and a sectional view showing a memory cell of a conventional SRAM.
Figure 28:
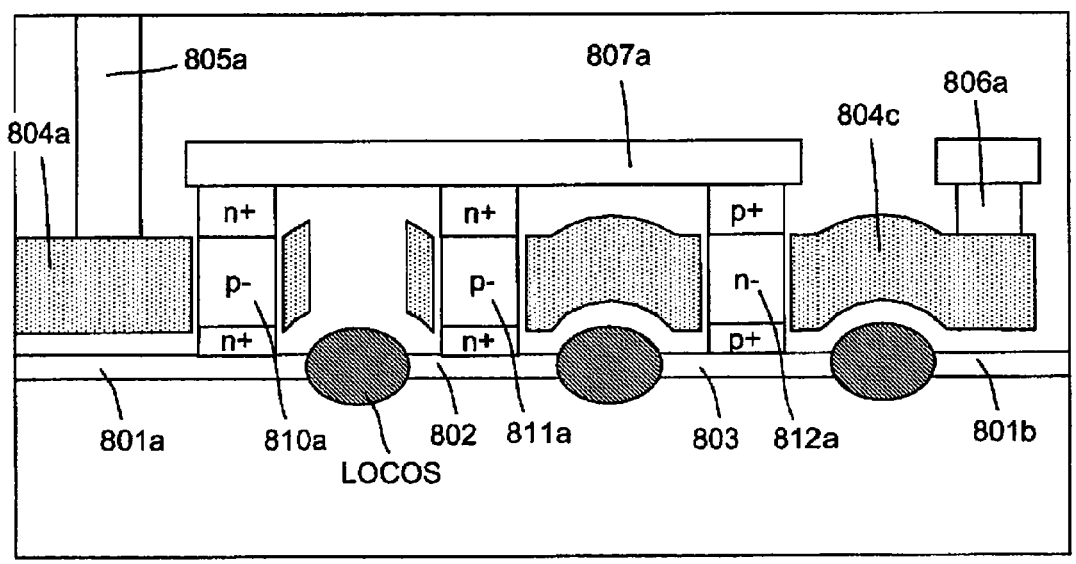

As shown in FIG. 27d, a P$^+$ drain diffusion layer (704a, 704b) is formed in the planar silicon layer (702a, 702b) formed on the buried oxide film layer 701 to serve as a storage node. The pillar-shaped silicon layer 723b constituting the load transistor Qp28 is formed on the drain diffusion layer 704b, and a pillar-shaped silicon layer 723a constituting a load transistor Qp18 is formed on the drain diffusion layer 704a. The gate dielectric film 717 and the gate electrode 718 are formed around each of the pillar-shaped silicon layers. The P$^+$ source diffusion layer 716 is formed in an upper portion of the pillar-shaped silicon layer by impurity implantation or the like, and the silicide layer 715 is formed in a surface of the source diffusion layer. Each of the contact 708b formed on the load transistor Qp28 and a contact 708a formed on the load transistor Qp18 is connected to the power supply potential line Vcc8.

As with the first to seventh embodiments, in the eighth embodiment, the N$^+$ drain diffusion layers and the P$^+$ drain diffusion layer each formed in the planar silicon layer serving as a storage node are directly connected to each other through the silicide layer formed in the surface of the planar silicon layer, so that the drain diffusion layers of the access transistor, the driver transistor and the load transistor serve as a storage node of the SRAM cell in a shared manner. Thus, element isolation is required only for isolating between the two storage nodes of the SRAM cell, without a need for element isolation for isolating between the N$^+$ and P$^+$ source/drain diffusion layers, which is generally necessary for a planar transistor. This makes it possible to achieve an extremely small SRAM cell area.

As described above, according to the present invention, in a static type memory made up using six MOS transistors, each of the MOS transistors is formed as an SGT where a drain, a gate and a source are arranged in a vertical direction, and an $N^+$ drain diffusion layer and a $P^+$ drain diffusion layer each formed in a planar silicon layer on a buried oxide film are directly connected to each other through a silicide layer formed in respective surfaces of the diffusion layers, to serve as a storage node. Thus, element isolation is required only for isolating between two storage nodes of an SRAM cell, without a need for element isolation for isolating between the $N^+$ and $P^+$ source/drain diffusion layers, which is generally necessary for a planar transistor. This makes it possible to achieve a CMOS 6-T SRAM with an extremely small memory cell area.

What is claimed is:

1. A semiconductor storage device comprising a static type memory cell in which six MOS transistors are arrayed on a dielectric film formed on a substrate, wherein:
    each of the six MOS transistors serves as (a) first and second NMOS access transistors each operable to access to the memory cell, (b) first and second NMOS driver transistors each operable to drive a storage node to hold data in the memory cell, and (c) first and second PMOS load transistors each operable to supply electric charges to hold data in the memory cell,
    each of the first and second NMOS access transistors comprises a first diffusion layer, which is layered, along with a first pillar-shaped semiconductor layer and a second diffusion layer, vertically on the dielectric film formed on the substrate, the first pillar-shaped semiconductor layer being disposed between the first and second diffusion layers, and the first pillar-shaped semiconductor layer being formed with a gate arranged along a sidewall thereof,
    each of the first and second NMOS driver transistors comprises a third diffusion layer, which is layered, along with a second pillar-shaped semiconductor layer and a fourth diffusion layer, vertically on the dielectric film formed on the substrate, the second pillar-shaped semiconductor layer being disposed between the third and fourth diffusion layers, the second pillar-shaped semiconductor layer being formed with a gate arranged along a sidewall thereof, and
    each of the first and second PMOS load transistors comprises a fifth diffusion layer, which is layered, along with a third pillar-shaped semiconductor layer and a sixth diffusion layer, vertically on the dielectric film formed on the substrate, the third pillar-shaped semiconductor layer being disposed between the fifth and sixth diffusion layers, the third pillar-shaped semiconductor layer being formed with a gate arranged along a sidewall thereof, and further wherein:
    the first NMOS access transistor, the first NMOS driver transistor and the first PMOS load transistor are arrayed adjacent to each other;
    the second NMOS access transistor, the second NMOS driver transistor and the second PMOS load transistor are arrayed adjacent to each other;
    the first diffusion layer of the first NMOS access transistor, the third diffusion layer of the first NMOS driver transistor and the fifth diffusion layer of the first PMOS load transistor are arranged on the dielectric film to serve as a first storage node for holding data therein;
    the first diffusion layer, the third diffusion layer and the fifth diffusion layer are connected to each other through a first silicide layer formed on respective surfaces of the first, third and fifth diffusion layers;
    the first diffusion layer of the second NMOS access transistor, the third diffusion layer of the second NMOS driver transistor and the fifth diffusion layer of the second PMOS load transistor are arranged on the dielectric film to serve as a second storage node for holding data therein; and
    the first diffusion layer, the third diffusion layer and the fifth diffusion layer are connected to each other through a second silicide layer formed on respective surfaces of the first, third and fifth diffusion layers serving as the second storage node.

2. The semiconductor storage device as defined in claim 1, wherein:
    the gates of the first NMOS driver transistor and the first PMOS load transistor formed on the diffusion layers to serve as the first storage node are each formed with a first gate line extending therefrom which is connected to a first common contact; and
    the gates of the second NMOS driver transistor and the second PMOS load transistor formed on the diffusion layers to serve as the second storage node are each formed with a second gate line extending therefrom which is connected to a second common contact.

3. The semiconductor storage device as defined in claim 1, wherein the sidewall of each of the pillar-shaped semiconductor layers forming the first and second NMOS driver transistors is longer in peripheral length than the sidewall of each of the pillar-shaped semiconductor layers forming the first and second PMOS road transistors.

4. The semiconductor storage device as defined in claim 1, wherein the pillar-shaped semiconductor layers forming the first and second NMOS driver transistors are oval in cross-section, and the sidewall of each of the pillar-shaped semiconductor layers forming the first and second NMOS driver transistors is thereby made longer in peripheral length than the sidewall of each of the pillar-shaped semiconductor layers forming the first and second PMOS road transistors.

5. The semiconductor storage device as defined in claim 1, wherein the sidewall of each of the pillar-shaped semiconductor layers forming the first and second NMOS driver transistors is longer in peripheral length than the sidewall of each of the pillar-shaped semiconductor layers forming the first and second NMOS access transistors.

6. The semiconductor storage device as defined in claim 1, wherein the pillar-shaped semiconductor layers forming the first and second NMOS driver transistors are oval in cross-section, and the sidewall of each of the pillar-shaped semiconductor layers forming the first and second NMOS driver transistors is thereby made longer in peripheral length than the sidewall in each of the pillar-shaped semiconductor layers forming the first and second NMOS access transistors.

7. The semiconductor storage device as defined in claim 1, wherein the sidewall of each of the pillar-shaped semiconductor layers forming the first and second PMOS road transistors is shorter in peripheral length than the sidewall of each of the pillar-shaped semiconductor layers forming the first and second NMOS access transistors.

8. The semiconductor storage device as defined in claim 1, wherein at least one of third and fourth contacts formed on third and fourth gate lines extending respectively from gate electrodes of the first and second NMOS access transistors provides a common contact formed on a gate line extending from a gate electrode of an NMOS access transistor in an adjacent memory cell.

9. The semiconductor storage device as defined in claim 1, wherein the pillar-shaped semiconductor layers are arrayed in a hexagonal lattice pattern.

10. The semiconductor storage device as defined in claim 1, wherein:
the gates of the first NMOS driver transistor and the first PMOS load transistor formed on the diffusion layers to serve as the first storage node are each formed with a fifth gate line extending therefrom which is connected to one of the diffusion layers serving as the second storage node, through a first common contact; and
the gates of the second NMOS driver transistor and the second PMOS load transistor formed on the diffusion layers to serve as the second storage node are each formed with a sixth gate line extending therefrom which is connected to one of the diffusion layers serving as the first storage node, through a second common contact.

11. The semiconductor storage device as defined in claim 1, wherein the six MOS transistors are arranged on the dielectric film in an array of three rows by two columns, wherein:
the first NMOS access transistor is arranged at an intersection of the 1st row and the 1st column;
the first PMOS load transistor is arranged at an intersection of the 2nd row and the 1st column;
the first NMOS driver transistor is arranged at an intersection of the 3rd row and the 1st column;
the second NMOS access transistor is arranged at an intersection of the 3rd row and the 2nd column;
the second PMOS load transistor is arranged at an intersection of the 2nd row and the 2nd column; and
the second NMOS driver transistor is arranged at an intersection of the 1st row and the 2nd column.

12. The semiconductor storage device as defined in claim 1, wherein the six MOS transistors are arranged on the dielectric film in an array of three rows by two columns, wherein:
the first NMOS access transistor is arranged at an intersection of the 1st row and the 1st column;
the first PMOS load transistor is arranged at an intersection of the 3rd row and the 1st column;
the first NMOS driver transistor is arranged at an intersection of the 2nd row and the 1st column;
the second NMOS access transistor is arranged at an intersection of the 3rd row and the 2nd column;
the second PMOS load transistor is arranged at an intersection of the 1st row and the 2nd column; and
the second NMOS driver transistor is arranged at an intersection of the 2nd row and the 2nd column.

13. The semiconductor storage device as defined in claim 1, wherein the six MOS transistors are arranged on the dielectric film in an array of three rows by two columns, wherein:
the first NMOS access transistor is arranged at an intersection of the 1st row and the 1st column;
the first PMOS load transistor is arranged at an intersection of the 3rd row and the 1st column;
the first NMOS driver transistor is arranged at an intersection of the 2nd row and the 1st column;
the second NMOS access transistor is arranged at an intersection of the 1st row and the 2nd column;
the second PMOS load transistor is arranged at an intersection of the 3rd row and the 2nd column; and
the second NMOS driver transistor is arranged at an intersection of the 2nd row and the 2nd column.

14. The semiconductor storage device as defined in claim 13, wherein a fifth contact formed on a seventh gate line extending from the gate of the first NMOS access transistor provides a common contact formed on a gate line extending from the gate of the second NMOS access transistor.

15. The semiconductor storage device as defined in claim 1, wherein the six MOS transistors are arranged on the dielectric film in an array of two rows by three columns, wherein:
the first NMOS access transistor is arranged at an intersection of the 1st row and the 1st column;
the first PMOS load transistor is arranged at an intersection of the 2nd row and the 2nd column;
the first NMOS driver transistor is arranged at an intersection of the 2nd row and the 1st column;
the second NMOS access transistor is arranged at an intersection of the 2nd row and the 3rd column;
the second PMOS load transistor is arranged at an intersection of the 1st row and the 2nd column; and
the second NMOS driver transistor is arranged at an intersection of the 1st row and the 3rd column.

* * * * *